United States Patent
Inoue et al.

(10) Patent No.: US 10,707,442 B2
(45) Date of Patent: Jul. 7, 2020

(54) COMPOSITE GAS BARRIER MULTILAYER BODY, METHOD FOR PRODUCING THE SAME, AND COMPOSITE ELECTRODE

(71) Applicant: ZEON CORPORATION, Tokyo (JP)

(72) Inventors: Hiroyasu Inoue, Tokyo (JP); Atsushi Ishiguro, Tokyo (JP); Yohei Koide, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 65 days.

(21) Appl. No.: 14/428,683

(22) PCT Filed: Sep. 20, 2013

(86) PCT No.: PCT/JP2013/075494
§ 371 (c)(1),
(2) Date: Mar. 17, 2015

(87) PCT Pub. No.: WO2014/050743
PCT Pub. Date: Apr. 3, 2014

(65) Prior Publication Data
US 2015/0249228 A1 Sep. 3, 2015

(30) Foreign Application Priority Data
Sep. 28, 2012 (JP) .................................. 2012-218448

(51) Int. Cl.
*B32B 27/08* (2006.01)
*H01L 51/52* (2006.01)
(Continued)

(52) U.S. Cl.
CPC ............ *H01L 51/5256* (2013.01); *B32B 7/12* (2013.01); *B32B 15/08* (2013.01); *B32B 15/085* (2013.01);
(Continued)

(58) Field of Classification Search
CPC .................................................... H01L 51/5256
(Continued)

(56) References Cited

U.S. PATENT DOCUMENTS 5,700,874 A * 12/1997 Takeichi .................. C08F 8/42
525/250
6,245,437 B1 * 6/2001 Shiiki ...................... B32B 27/08
428/36.6
(Continued)

FOREIGN PATENT DOCUMENTS

CN 102458840 A 5/2012
JP S63-264688 A 11/1988
(Continued)

OTHER PUBLICATIONS

Machine_English_Translation_JP_2005162986_A1; Yasu, Katsuhiko; Moisture Preventing Electrically Insulating Coating Material and Method for Manufacturing Electric Parts Subjected to Electrically Insulating Treatment; Jun. 23, 2005; JPO; whole document.*

(Continued)

*Primary Examiner* — Tahseen Khan
(74) *Attorney, Agent, or Firm* — Oliff PLC

(57) ABSTRACT

A composite gas barrier multilayer body, wherein a gas barrier multilayer body (A) having a film (a) of an alicyclic polyolefin resin and an inorganic layer (a) formed on at least one surface of the film (a) and a gas barrier multilayer body (B) having a film (b) of an alicyclic polyolefin resin and an inorganic layer (b) formed on at least one surface of the film (b) are bonded via a layer of a styrene-based thermoplastic elastomer resin so that the inorganic layer (a) and the inorganic layer (b) face to each other.

10 Claims, 2 Drawing Sheets

(51) Int. Cl.
| | |
|---|---|
| B32B 37/00 | (2006.01) |
| B32B 27/30 | (2006.01) |
| B32B 27/32 | (2006.01) |
| B32B 15/08 | (2006.01) |
| B32B 15/085 | (2006.01) |
| B32B 25/16 | (2006.01) |
| B32B 15/20 | (2006.01) |
| B32B 25/08 | (2006.01) |
| B32B 7/12 | (2006.01) |
| B32B 38/00 | (2006.01) |
| H01L 51/00 | (2006.01) |
| B32B 38/06 | (2006.01) |
| B32B 37/06 | (2006.01) |
| B32B 37/20 | (2006.01) |

(52) U.S. Cl.
CPC .............. *B32B 15/20* (2013.01); *B32B 25/08* (2013.01); *B32B 25/16* (2013.01); *B32B 27/08* (2013.01); *B32B 27/302* (2013.01); *B32B 27/32* (2013.01); *B32B 27/325* (2013.01); *B32B 37/0015* (2013.01); *B32B 38/004* (2013.01); *H01L 51/5203* (2013.01); *H01L 51/5253* (2013.01); *B32B 37/06* (2013.01); *B32B 37/206* (2013.01); *B32B 38/06* (2013.01); *B32B 2255/10* (2013.01); *B32B 2255/20* (2013.01); *B32B 2255/205* (2013.01); *B32B 2274/00* (2013.01); *B32B 2307/412* (2013.01); *B32B 2307/7242* (2013.01); *B32B 2307/7244* (2013.01); *B32B 2307/7246* (2013.01); *B32B 2309/105* (2013.01); *B32B 2323/00* (2013.01); *B32B 2355/00* (2013.01); *B32B 2457/12* (2013.01); *B32B 2457/20* (2013.01); *B32B 2457/206* (2013.01); *H01L 51/0097* (2013.01); *Y10T 428/24975* (2015.01); *Y10T 428/263* (2015.01); *Y10T 428/31938* (2015.04)

(58) Field of Classification Search
USPC ........................................................ 428/216
See application file for complete search history.

(56) References Cited

U.S. PATENT DOCUMENTS

| | | |
|---|---|---|
| 7,063,768 B2 | 6/2006 | Tsujimoto et al. |
| 7,452,440 B1 | 11/2008 | Tsujimoto et al. |
| 2003/0100683 A1* | 5/2003 | Toyoizumi ............. C08C 19/02 525/331.9 |
| 2003/0159777 A1 | 8/2003 | Tsujimoto et al. |
| 2004/0054094 A1* | 3/2004 | Hashizume ............. C08F 8/04 525/333.3 |
| 2005/0224174 A1 | 10/2005 | Tsujimoto et al. |
| 2007/0148443 A1* | 6/2007 | Blum ........................ C09J 5/08 428/343 |
| 2008/0295958 A1 | 12/2008 | Tsujimoto et al. |
| 2010/0068514 A1 | 3/2010 | Ellinger et al. |
| 2011/0014476 A1* | 1/2011 | Guy ........................ B32B 27/28 428/412 |
| 2012/0021184 A1* | 1/2012 | Peng ........................ B32B 7/02 428/172 |
| 2012/0064318 A1 | 3/2012 | Keite-Telgenbuscher et al. |
| 2013/0021667 A1* | 1/2013 | Tsuburaya ............. B32B 27/08 359/489.07 |
| 2013/0240021 A1* | 9/2013 | Mu ........................ B29C 48/21 136/251 |

FOREIGN PATENT DOCUMENTS

| | | | |
|---|---|---|---|
| JP | H03-063127 A | | 3/1991 |
| JP | 2005162986 A1 * | | 6/2005 |
| JP | 2005-327687 A | | 11/2005 |
| JP | 2008-197224 A | | 8/2008 |
| JP | 2009-178956 A | | 8/2009 |
| JP | 2009-190186 A | | 8/2009 |
| JP | 2012-171984 A | | 9/2012 |
| JP | 2012-524677 A | | 10/2012 |
| KR | 10-2002-0076161 A | | 10/2002 |
| KR | 10-2004-0000297 A | | 1/2004 |
| KR | 10-2012-0014175 A | | 2/2012 |
| TW | 201024389 A | | 7/2010 |
| WO | WO2011118661 A1 * | | 9/2011 |

OTHER PUBLICATIONS

Dec. 24, 2013 Written Opinion issued in International Application No. PCT/JP2013/075494.

Dec. 24, 2013 International Search Report issued in International Application No. PCT/JP2013/075494.

May 16, 2015 extended European Search Report issued in Application No. 13842646.5.

Jul. 6, 2018 Office Action issued in European Patent Application No. 13 842 646.5.

* cited by examiner

COMPOSITE GAS BARRIER MULTILAYER BODY, METHOD FOR PRODUCING THE SAME, AND COMPOSITE ELECTRODE

FIELD

The present invention relates to a composite gas barrier multilayer body, a method for producing the same, and a composite electrode provided with the same.

BACKGROUND

A photoelectric conversion element such as a solar cell and an electroluminescent element (sometimes referred to hereinbelow as "EL element" as appropriate) may be provided with a member having gas barrier properties in order to prevent moisture vapor and oxygen from entering the internal of the element. In particular, an organic photoelectric conversion element such as an organic solar cell and an organic EL element is required to be provided with a member having excellent gas barrier properties since deterioration of an organic material inside the element by moisture vapor and oxygen may largely decrease the performance of the element.

As such a member, for example, a member having an inorganic layer has been known (see, for example, Patent Literature 1). In general, since the inorganic layer has an excellent ability of cutting off moisture vapor and oxygen, gas barrier properties can be achieved with the inorganic layer. As the thickness of the inorganic layer is increased, higher gas barrier properties can be expected. For example, Patent Literature 2 proposes a high barrier plastic in which films with silicon oxide are bonded to each other, and Patent Literature 3 proposes a gas barrier multilayer body having a plurality of inorganic layers.

CITATION LIST

Patent Literature

Patent Literature 1: Japanese Patent Application Laid-Open No. 2005-327687 A
Patent Literature 2: Japanese Patent Application Laid-open No. Hei. 03-063127 A
Patent Literature 3: Japanese Patent Application Laid-Open No. 2009-190186 A

SUMMARY

Technical Problem

However, a gas barrier multilayer body having an inorganic layer causes curling (warping) when the thickness of the inorganic layer is large. It is considered that the curling is due to the difference in thermal expansion coefficient between the inorganic layer and a layer other than the inorganic layer in the gas barrier multilayer body. Specifically, when a temperature changes during production or use of the gas barrier multilayer body, the inorganic layer and the layer other than the inorganic layer cause expansion or shrinkage in different degrees. It is considered that these different degrees cause the gas barrier multilayer body to be warped. This will be described with reference to a specific example. For example, for obtaining a gas barrier multilayer body having an inorganic layer on a resin film, a step of forming the inorganic layer on the resin film is usually performed in a high-temperature environment. After that, a resultant gas barrier multilayer body is cooled. At that time, since the inorganic layer and the resin film are usually different in thermal expansion coefficient, the resin film largely shrinks by cooling as compared with the inorganic layer. Consequently, the gas barrier multilayer body is often curled so that the inorganic layer is outside and the resin film is inside. In particular, in order to achieve a moisture vapor barrier property of $1 \times 10^{-2}$ g/m$^2$·day or less, a sufficiently thick inorganic layer is desired. As a result of this, the gas barrier multilayer body is largely curled. When the gas barrier multilayer body is largely curled, the handleability of the gas barrier multilayer body is reduced. Therefore, it is difficult to mount the gas barrier multilayer body on a photoelectric conversion element. Accordingly, development of a gas barrier multilayer body configuration that improves a curl has been required.

A configuration like Patent Literature 2 can improve a curl, but has problems of an increase in a gas component generated from a bonding agent and loss of flexibility due to use of an energy curable bonding agent. Further, a gas barrier multilayer body is desired to prevent a reduction in gas barrier properties under a high-temperature environment and a deterioration of gas barrier properties due to easy appearing of a crack. This is for suppressing a reduction in the gas barrier properties of the gas barrier multilayer body, for example, during use, storage, or transportation, so as to maintain favorable gas barrier properties.

The present invention has been made in view of the problems. It is an object of the present invention to provide a composite gas barrier multilayer body that allows gas barrier properties to be favorably maintained, is pliable, has excellent flexibility, and has low tendency to cause curling, a method for producing the same, and a composite electrode provided with the same.

Solution to Problem

The present inventor has intensively studied to solve the problems. As a result, the inventor has found out that when two gas barrier multilayer bodies having an inorganic layer and a film of an alicyclic polyolefin resin are bonded via a layer of a styrene-based thermoplastic elastomer resin so that the inorganic layers face to each other, a composite gas barrier multilayer body that easily allows gas barrier properties to be favorably maintained, is pliable, has excellent flexibility, and has low tendency to cause curling can be obtained. Thus, the present invention has been completed.

Accordingly, the present invention is as follows.

[1] A composite gas barrier multilayer body, comprising:
a gas barrier multilayer body (A) having a film (a) of an alicyclic polyolefin resin and an inorganic layer (a) formed on at least one surface of the film (a) and
a gas barrier multilayer body (B) having a film (b) of an alicyclic polyolefin resin and an inorganic layer (b) formed on at least one surface of the film (b)
wherein the gas barrier multilayer body (A) and the gas barrier multilayer body (B) are bonded via a layer of a styrene-based thermoplastic elastomer resin so that the inorganic layer (a) and the inorganic layer (b) face to each other.

[2] The composite gas barrier multilayer body according to [1], wherein
the layer of the thermoplastic elastomer resin has a thickness of 10 µm to 150 µm, and
the thermoplastic elastomer resin comprises a hydride of a styrene-conjugated diene block copolymer.

[3] The composite gas barrier multilayer body according to [1] or [2], wherein the inorganic layer (a) and the inorganic layer (b) are each a layer that is formed by a chemical vapor deposition method and contains at least Si, and the inorganic layer (a) and the inorganic layer (b) each have a thickness of 300 nm to 2,000 nm.

[4] The composite gas barrier multilayer body according to any one of [1] to [3], wherein the inorganic layer (a) and the inorganic layer (b) are formed of the same material and have the same thickness, and the film (a) and the film (b) are formed of the same material and have the same thickness.

[5] A composite electrode for an organic EL element, comprising the composite gas barrier multilayer body according to any one of [1] to [4], and a transparent electrode formed on one outside surface of the composite gas barrier multilayer body by a physical vapor deposition method.

[6] A method for producing a composite gas barrier multilayer body, comprising the steps of:

forming an inorganic layer (a) on at least one surface of a film (a) of an alicyclic polyolefin resin to obtain a gas barrier multilayer body (A);

forming an inorganic layer (b) on at least one surface of a film (b) of an alicyclic polyolefin resin to obtain a gas barrier multilayer body (B); and stacking the gas barrier multilayer body (A), the gas barrier multilayer body (B), and a film (c) of a styrene-based thermoplastic elastomer resin so that the film (a), the inorganic layer (a), the film (c), the inorganic layer (b), and the film (b) are layered in this order, and then thermally compression-bonding the stack.

Advantageous Effects of Invention

The present invention can provide a composite gas barrier multilayer body that allows gas barrier properties to be favorably maintained, is pliable, has excellent flexibility, and has low tendency to cause curling, a method for producing the same, and a composite electrode provided with the same.

DESCRIPTION OF EMBODIMENTS

The present invention will be described hereinbelow in detail by way of embodiments and examples. However, the present invention is not limited to the following embodiments and examples. The present invention may be implemented with any modifications within the scope of the claims and equivalents thereto.

[1. Summary of Composite Gas Barrier Multilayer Body]

Figure 1:
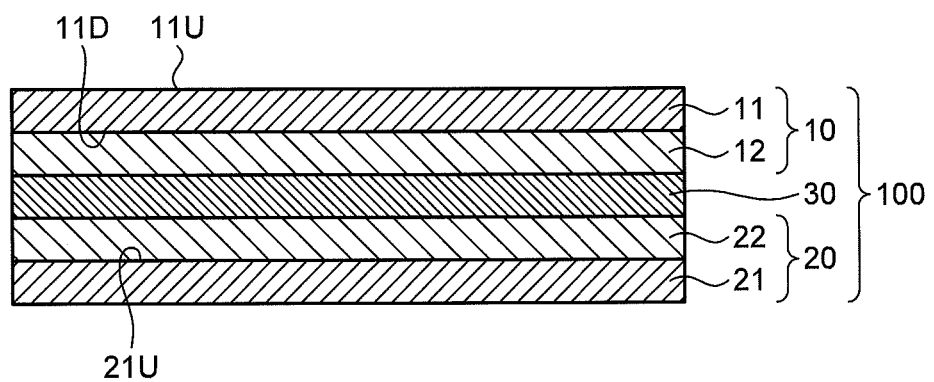
FIG. 1 is a view schematically illustrating a cross section of a composite gas barrier multilayer body according to an embodiment of the present invention, the cross section being along a plane perpendicular to a principal plane thereof.

FIG. 1 is a view schematically illustrating a cross section of a composite gas barrier multilayer body 100 according to an embodiment of the present invention, the cross section being along a plane perpendicular to a principal plane thereof. As shown in FIG. 1, the composite gas barrier multilayer body 100 is a multilayer body in which a gas barrier multilayer body (A) 10 having a film (a) 11 and an inorganic layer (a) 12 and a gas barrier multilayer body (B) 20 having a film (b) 21 and an inorganic layer (b) 22 are bonded via a layer 30 of a styrene-based thermoplastic elastomer resin so that the inorganic layer (a) 12 and the inorganic layer (b) 22 face to each other. Therefore, the composite gas barrier multilayer body 100 has the film (a) 11, the inorganic layer (a) 12, the layer 30 of a styrene-based thermoplastic elastomer resin, the inorganic layer (b) 22, and the film (b) in this order.

[2. Gas Barrier Multilayer Body (A)]

As shown in FIG. 1, the gas barrier multilayer body (A) 10 has the film (a) 11 and the inorganic layer (a) 12 that is formed on at least one surface 11D of the film (a) 11. Therefore, the film (a) 11 is usually in direct contact with the inorganic layer (a) 12.

[2.1. Film (a)]

The film (a) is formed of an alicyclic polyolefin resin. The alicyclic polyolefin resin herein is a resin containing an alicyclic olefin polymer and if necessary, an optional component other than the polymer. The alicyclic polyolefin resin has low moisture vapor transmission rate. The amount of outgas emission from the alicyclic polyolefin resin in a step of forming another layer included in the gas barrier multilayer body (A) (for example, deposition and sputtering) is at a low level. Therefore, when the film (a) is formed of the alicyclic polyolefin resin, the gas barrier properties of the composite gas barrier multilayer body can be enhanced. A film produced by melt-extruding the alicyclic polyolefin resin has favorable surface smoothness. Thus a convex portion on the surface that may cause an inorganic layer to crack is small. Therefore, the moisture vapor transmission rate can be decreased even using a thin inorganic layer as compared with a film having poor surface smoothness. Accordingly, the productivity and the flexibility are excellent. Further, the film (a) is usually a substrate that supports an inorganic layer (a) and also exerts an effect of maintaining the strength of the gas barrier multilayer body (A).

The alicyclic olefin polymer is an amorphous thermoplastic polymer having an alicyclic structure on a main chain and/or a side chain. Examples of the alicyclic structure in the alicyclic olefin polymer may include saturated alicyclic hydrocarbon (cycloalkane) structure and unsaturated alicyclic hydrocarbon (cycloalkene) structure. The cycloalkane structure is preferred in terms of mechanical strength, heat resistance, and the like. The number of carbon atoms constituting the alicyclic structure is not specifically limited. The number of carbon atoms is normally 4 or more and preferably 5 or more, and normally 30 or less, preferably 20 or less, and more preferably 15 or less. When the number of carbon atoms constituting the alicyclic structure falls within the range, properties of mechanical strength, heat resistance, and film formability are highly balanced, which is preferable.

The ratio of a structural unit having an alicyclic structure in the alicyclic olefin polymer is preferably 55% by weight or more, more preferably 70% by weight or more, and particularly preferably 90% by weight or more, and normally 100% by weight or less. The ratio of the structural unit having an alicyclic structure in the alicyclic olefin polymer in this range is preferred in terms of transparency and heat resistance.

Examples of the alicyclic olefin polymer may include a norbornene polymer, a monocyclic olefin polymer, a cyclic conjugated diene polymer, a vinyl alicyclic hydrocarbon polymer, and hydride thereof. Among them, a norbornene polymer has a favorable transparency and formability, and therefore may be suitably used.

Examples of the norbornene polymer may include a ring-opening polymer of a monomer having a norbornene structure, a ring-opening copolymer of a monomer having a norbornene structure and another monomer, or hydride thereof; and an addition polymer of a monomer having a norbornene structure, an addition copolymer of a monomer having a norbornene structure and another monomer, or a hydride thereof. Among them, a ring-opening polymer hydride and a ring-opening copolymer hydride of a monomer having a norbornene structure may be particularly suitably used in terms of transparency, formability, heat resistance, low hygroscopicity, size stability, lightweight properties, and the like.

As the alicyclic olefin polymer, one type thereof may be solely used, or two or more types thereof may be used in combination at any ratio. The film (a) may have a layered structure of various types of alicyclic olefin resins each of which forms a layer.

The molecular weight of the alicyclic olefin polymer contained in the alicyclic olefin resin is appropriately selected in accordance with the intended use. It is preferable that the weight average molecular weight (Mw) thereof falls within a specific range. Specifically, the weight average molecular weight of the alicyclic olefin polymer is normally 10,000 or more, preferably 15,000 or more, and more preferably 20,000 or more, and normally 100,000 or less, preferably 80,000 or less, and more preferably 50,000 or less. When the weight average molecular weight falls within such a range, the mechanical strength, molding processability and the like of the film (a) are highly balanced, which is preferable. The weight average molecular weight herein may be measured as a value in terms of polyisoprene by gel permeation chromatography using cyclohexane as a solvent. In a case where the polymer does not dissolve in cyclohexane, toluene may be used as the solvent. When the solvent is toluene, the weight average molecular weight may be measured as a value in terms of polystyrene.

Examples of the optional components that may be contained in the alicyclic olefin resin may include additives such as an antioxidant, a thermal stabilizer, a photostabilizer, a ultraviolet absorber, an antistatic agent, a dispersant, a chlorine scavenging agent, a flame retarder, a crystallization nucleating agent, a toughening agent, an anti-blocking agent, an anti-fogging agent, a release agent, a pigment, an organic or inorganic filler, a neutralizer, a slip additive, a decomposer, a metal inactivating agent, an antifouling material, an antibacterial agent, another resin, and a thermoplastic elastomer. One type of them may be solely used, or two or more types thereof may be used in combination at any ratio. The amount of the optional component is normally 0 to 50 parts by weight, and preferably 0 to 30 parts by weight with respect to 100 parts by weight of the polymer in the alicyclic olefin resin.

The alicyclic olefin resin is not necessarily limited to a resin having a high transparency. However, an alicyclic olefin resin having a high transparency is preferred since thereby the composite gas barrier multilayer body can be advantageously used in a portion that is required to transmit light in, for example, a display device, a light source device, or a solar cell. For example, it is preferable that the total light transmittance of the alicyclic olefin resin measured using a test piece having a thickness of 1 mm of the alicyclic olefin resin is normally 70% or higher, preferably 80% or higher, and more preferably 90% or higher, and normally 100% or lower.

The thickness of the film (a) is preferably 10 μm or more and more preferably 30 μm or more, and preferably 500 μm or less and more preferably 250 μm or less. The thickness of the film (a) may be measured with a contact-type film thickness meter. Specifically, the thicknesses may be measured at 10 points equally spaced on a line parallel to a TD direction, and an average value thereof may be calculated. The calculated average value may be taken as a measured value of the thickness.

The thermal expansion coefficient of the film (a) is preferably 70 ppm/K or less, more preferably 50 ppm/K or less, and further preferably 40 ppm/K or less. Such a thermal expansion coefficient may be determined by measuring elongation of the length of the film (a) as a test peace of 20 mm×5 mm when the temperature is increased from 30° C. to 130° C. under conditions of a load of 5.0 g, a nitrogen of 100 cc/min, and a temperature increasing rate of 0.5° C./min.

The humidity expansion coefficient of the film (a) is preferably 30 ppm/% RH or less, more preferably 10 ppm/% RH or less, and further preferably 1.0 ppm/% RH or less. Such a humidity expansion coefficient may be determined by measuring elongation of the length of the film as a test peace of 20 mm×5 mm when the humidity is increased from 30% RH to 80% RH under conditions of a load of 5.0 g, nitrogen of 100 cc/min, a temperature of 25° C., and a rate of 5.0% RH/min.

The glass transition temperature of the film (a) is preferably 110° C. or higher, more preferably 130° C. or higher, and particularly preferably 160° C. or higher. When the glass transition temperature is high, thermal shrinkage of the film (a) before and after thermal history such as a high-temperature environment can be suppressed.

As a result of achieving such a preferable thermal expansion coefficient, humidity expansion coefficient and glass transition temperature, a composite gas barrier multilayer body in which reduction in gas barrier properties under a high temperature and high humidity environment is inhibited can be obtained.

The lower limit of thermal expansion coefficient of the film (a) is normally 0.1 ppm/K or more. The lower limit of humidity expansion coefficient of the film (a) is normally 0.001 ppm/% RH or more. The upper limit of glass transition temperature of the film (a) is normally 250° C. or lower.

On a surface of the film (a) opposite to the inorganic layer (a) (surface 11U in FIG. 1), a concavo-convex structure may be formed. Due to the concavo-convex structure, blocking is unlikely to occur in the film (a). For example, when the composite gas barrier multilayer body is produced using a long-length film (a) by a roll-to-roll method, the film (a) can be easily unrolled from a roll. Therefore, production can be facilitated. The surface of the film (a) opposite to the inorganic layer (a) is usually the outermost surface of the composite gas barrier multilayer body. When a concavo-convex structure is formed on the surface of the film (a) opposite to the inorganic layer (a), the composite gas barrier multilayer body has the concavo-convex structure on the outermost surface thereof. Therefore, blocking of the composite gas barrier multilayer body can be suppressed.

The arithmetic average roughness Ra (JIS B601-2001) of the surface having a concavo-convex structure is preferably 0.02 μm or more, more preferably 0.1 μm or more, and particularly preferably 3 μm or more. When the arithmetic average roughness Ra is equal to or more than the lower limit of the range, the surface having a concavo-convex structure has favorable slidability and blocking can be stably prevented. The upper limit of the arithmetic average roughness is not particularly limited, but preferably 50 μm or less, more preferably 25 μm or less, and particularly preferably 10 μm or less.

A method for producing the film (a) is not particularly limited, and for example, any of a melt molding method and a solution casting method may be used. For example, the melt molding method may be specifically classified into an extrusion molding method, a press molding method, an inflation molding method, an injection molding method, a blow molding method, and a stretch molding method. Among these methods, the extrusion molding method, the inflation molding method, and the press molding method are preferred since thereby the film (a) that has excellent mechanical strength and surface precision can be obtained, and the extrusion molding method is particularly preferred in terms of efficient and simple production of the film (a).

In the method for producing the film (a), for example, a stretching step for stretching a film may be performed. Thus, a stretched film can be obtained as the film (a). When the stretched film is used as the film (a), the thermal expansion coefficient of the film (a) can be suppressed, whereby the degradation of gas barrier performance under a high temperature and high humidity environment can be further reduced. Such a stretched film can be obtained by, for example, shaping an alicyclic olefin resin into a raw film through the above-described method and stretching the raw film.

The shape of the raw film may be appropriately set so that a desired stretching ratio gives the film (a) having a desired size. Preferably, the raw film has a long-length film shape. The expression "long-length" herein means a shape whose length is at least 5 times or more longer than a width, and preferably 10 times or more longer than the width, and specifically means a shape having a length capable of being wound up into a roll shape for storage or transportation.

The mode of the stretching may be biaxial stretching. Such biaxial stretching may be performed by stretching the raw film in two directions that are parallel to the surface thereof and are perpendicular to each other. The directions that are "perpendicular" preferably form an angle of 90°. Such an angle may also have a tolerance of approximately ±10°.

Normally, the two directions that are perpendicular to each other are set along the MD direction of the long-length raw film (a flowing direction of the raw film, that is a length direction of the long-length raw film) and the TD direction of the long-length raw film (a width direction of the raw film, that is perpendicular to the MD direction), respectively. However, the two directions are not limited to these directions. The two directions may be two directions that are perpendicular to each other and oblique to the MD and TD directions.

The mode of the biaxial stretching may be sequential biaxial stretching or simultaneous biaxial stretching. The sequential biaxial stretching herein means stretching in which respective stretching steps in two directions are performed as separate steps. The simultaneous biaxial stretching means stretching in which at least a part of the stretching steps in two directions are simultaneously performed. In terms of production efficiency, the simultaneous biaxial stretching is preferred. When each of the stretching steps in two directions is required to be controlled independently and precisely, such as when a retardation of the film (a) is required to be as low as possible, the sequential biaxial stretching may be preferred in order to facilitate such a control.

The stretching ratio of the biaxial stretching in each of two directions is preferably 1.05 times or more and more preferably 1.5 times or more, and preferably 4.5 times or less and more preferably 3.5 times or less. The ratio of the stretching ratios in the two directions is preferably within a range of 1:1 to 2:1, in order to minimize a change in moisture permeability under a high temperature and high humidity environment and to realize uniform light transmission through the composite gas barrier multilayer body.

The temperature during the biaxial stretching may be set based on the glass transition temperature Tg of the alicyclic polyolefin resin that forms the raw film. The temperature range during the biaxial stretching is preferably Tg or higher and Tg+30° C. or lower, and more preferably Tg+20° C. or lower. When the raw film has layers of a plurality of alicyclic olefin resin types each having a different glass transition temperature, the temperature range during the biaxial stretching may be set based on the lowest glass transition temperature in the alicyclic olefin resins.

Preferable examples of the apparatus used for performing biaxial stretching may include a tenter stretching machine, and other stretching machines having a guide rail and grippers moving along the guide rail. In addition, any other stretching machines such as a lengthwise uniaxial stretching machine, a bubble stretching machine, and a roller stretching machine may also be used.

When a concavo-convex structure is formed on the surface of the film (a), a method of forming a concavo-convex structure is not limited. Examples of the method of forming a concavo-convex structure may include: a nip molding method in which the film (a) is pressed using a shaping roller having a concavo-convex structure on the surface thereof to transfer the concavo-convex structure to the surface of the film (a); a method in which the film (a) is nipped by a release film having a concavo-convex structure on the surface thereof to transfer the concavo-convex structure of the release film to the film (a), and the release film is then separated from the film (a); a method in which particles are sprayed to the surface of the film (a) to cut the surface of the film (a); and a method in which an electron beam-curable resin is arranged on the surface of the film (a) and then cured to form a concavo-convex structure. Further, a concavo-convex structure may be formed by adjusting the composition of the film (a). Examples thereof may include a method of forming a concavo-convex structure by using the alicyclic polyolefin resin that includes particles with a specific particle diameter and forms the film (a); and a method of forming a concavo-convex structure by adjusting a mixing ratio of components contained in the alicyclic polyolefin resin that forms the film (a).

In general, blocking of the film (a) is likely to occur before formation of the inorganic layer (a) on the surface of the film (a). Therefore, in terms of prevention of blocking, it is preferable that a step of forming a concavo-convex structure on the surface of the film (a) is performed before a step of forming the inorganic layer (a) on the surface of the film (a).

[2.2. Inorganic Layer (a)]

The inorganic layer (a) is a layer that is formed of an inorganic material, and that can provide barrier ability against a component such as moisture and oxygen present in the outside air which may deteriorate a component inside the device such as a display device and a light-emitting device (for example, a light-emitting layer in an organic EL device). The inorganic layer (a) functions as a barrier against transmission of the component such as moisture and oxygen from one of front and back surfaces of the gas barrier multilayer body (A) to the other surface.

Since the inorganic layer (a) is located inside the film (a), damage of the inorganic layer (a) due to external force can be prevented. Therefore, the inorganic layer (a) is unlikely to crack and the gas barrier properties are unlikely to be impaired.

In general, the alicyclic polyolefin resin often has low affinity to other materials, while the inorganic layer (a) may have high affinity to both the alicyclic polyolefin resin and to a thermoplastic elastomer. Therefore, when the inorganic layer (a) is provided between the film (a) including the alicyclic polyolefin resin and the thermoplastic elastomer, adhesion between the film (a) and the thermoplastic elastomer can be improved.

Preferable examples of the inorganic material that may form the inorganic layer may include a metal; an oxide, a nitride, and a nitride oxide of silicon; an oxide, a nitride, and a nitride oxide of aluminum; a DLC (diamond-like carbon); and a mixed material of two or more thereof. In particular, a material containing at least silicon, such as an oxide or a nitride oxide of silicon is particularly preferred in terms of transparency. In terms of affinity to the alicyclic olefin resin that is the material for the film (a), a DLC is particularly preferred.

Examples of the oxide of silicon may include $SiO_x$. Herein, x is preferably $1.4<x<2.0$ in order to achieve both the transparency and the moisture vapor barrier properties of the inorganic layer (a). Further, examples of the oxide of silicon may include SiOC.

Examples of the nitride of silicon may include $SiN_y$. Herein, y is preferably $0.5<y<1.5$ in order to achieve both the transparency and the moisture vapor barrier properties of the inorganic layer (a).

Examples of the nitride oxide of silicon may include $SiO_pN_q$. In a case where improved adhesion of the inorganic layer (a) is regarded as important, it is preferable that p and q is $1<p<2.0$ and $0<q<1.0$, respectively, to render the inorganic layer (a) rich in oxygen. In a case where improved moisture vapor barrier properties of the inorganic layer (a) are regarded as important, it is preferable that p and q is $0<p<0.8$ and $0.8<q<1.3$, respectively, to render the inorganic layer (a) rich in nitrogen.

Examples of the oxide, nitride, and nitride oxide of aluminum may include $AlO_x$, $AlN_y$, and $AlO_pN_q$.

In particular, in terms of inorganic barrier properties, $SiO_pN_q$, $AlO_x$, or a mixture thereof may be preferably used as the material.

The thickness of the inorganic layer (a) is preferably 100 nm or more, more preferably 300 nm or more, and particularly preferably 500 nm or more, and preferably 2,500 nm or less, more preferably 2,000 nm or less, and particularly preferably 1,500 nm or less. When the thickness of the inorganic layer (a) is equal to or more than the lower limit of this range, favorable gas barrier properties can be achieved. When the thickness is equal to or less than the upper limit, yellow coloring of the composite gas barrier multilayer body can be suppressed while sufficient gas barrier properties are maintained.

The moisture vapor transmission rate of the film (a) with the inorganic layer (a), that is, the gas barrier multilayer body (A) is preferably $2\times10^{-2}$ g/m²·day or less, and more preferably $1\times10^{-2}$ g/m²·day or less. The lower limit of the moisture vapor transmission rate is preferably 0 g/m²·day. However, even when the moisture vapor transmission rate is 0 g/m²·day or more, the gas barrier multilayer body may be suitably used as long as the moisture vapor transmission rate falls within a range equal to or less than the upper limit.

The inorganic layer (a) may be formed on the surface of the film (a) that acts as a substrate by, for example, a layer-forming method such as a vapor deposition method, a sputtering method, an ion plating method, an ion beam assist vapor deposition method, an arc discharge plasma vapor deposition method, a heat CVD method, and a plasma CVD method. In particular, it is preferable to use a chemical vapor deposition method such as a heat CVD method and a plasma CVD method. With the chemical vapor deposition method, the inorganic layer (a) can be formed as a flexible layer by adjusting the gas component used in formation of the layer. When the flexible inorganic layer (a) is obtained, the inorganic layer (a) can follow the deformation of the film (a) and size change of the film (a) under an high temperature and high humidity environment. Therefore, the layer can be formed under a low-vacuum environment at a high layer forming rate, and favorable gas barrier properties can be achieved. When the inorganic layer (a) is formed by such a chemical vapor deposition method, the lower limit of the thickness is preferably 300 nm or more, and more preferably 500 nm or more, and the upper limit thereof is preferably 2,000 nm or less, and more preferably 1,500 nm or less.

[3. Gas Barrier Multilayer Body (B)]

As shown in FIG. 1, the gas barrier multilayer body (B) 20 has the film (b) 21 and the inorganic layer (b) 22 that is formed on at least one surface 21U of the film (b) 21. Therefore, the film (b) 21 is usually in direct contact with the inorganic layer (b) 22.

As a film (b), the same film as the film (a) may be used. Therefore, the material, shape, thickness, physical properties, and production method of the film (b) may be the same as in the description of the section of film (a). In the gas barrier multilayer body (B), the film (b) may exert the same effects as those exerted by the film (a) in the gas barrier multilayer body (A).

As the inorganic layer (b), the same layer as the inorganic layer (a) may be used. Therefore, the material, shape, thickness, physical properties, and production method of the inorganic layer (b) may be the same as in the description of the section of inorganic layer (a). In the gas barrier multilayer body (B), the inorganic layer (b) may exert the same effects as those exerted by the inorganic layer (a) in the gas barrier multilayer body (A). That is, the moisture vapor transmission rate of each of the gas barrier multilayer body (A) and the gas barrier multilayer body (B) can be $2\times10^{-2}$ g/m²·day or less, and thus the moisture vapor transmission rate of the composite gas barrier multilayer body can be $1\times10^{-2}$ g/m²·day or less. Accordingly, favorable gas barrier properties can be achieved.

In the composite gas barrier multilayer body, the gas barrier multilayer body (A) and the gas barrier multilayer body (B) are bonded to each other in such directions that a stress that causes curling of the gas barrier multilayer body (A) and a stress that causes curling of the gas barrier multilayer body (B) are canceled by each other. Therefore, when the stress that causes curling of the gas barrier multilayer body (A) and the stress that causes curling of the gas barrier multilayer body (B) are the same, curling of the composite gas barrier multilayer body can be stably prevented. In order to stably prevent curling of the composite gas barrier multilayer body, it is preferable that the film (b)

is formed of the same material as that for the film (a) and has the same thickness as that of the film (a), and the inorganic layer (b) is formed of the same material as that for inorganic layer (a) and has the same thickness as that of inorganic layer (a). The expression "the same" herein means such a range that the amount of curls of the gas barrier multilayer body (A) and the gas barrier multilayer body (B) are the same. Therefore, as long as the amounts of curls of the gas barrier multilayer body (A) and the gas barrier multilayer body (B) are the same, the film (a) and the film (b), and the inorganic layer (a) and the inorganic layer (b) may be different in thickness, component ratio of the material, and the like.

[4. Layer of Styrene-Based Thermoplastic Elastomer Resin]

As shown in FIG. 1, in the composite gas barrier multilayer body 100, the gas barrier multilayer body (A) 10 and the gas barrier multilayer body (B) 20 are bonded via the layer 30 of a styrene-based thermoplastic elastomer resin so that the inorganic layer (a) 12 and the inorganic layer (b) 22 face to each other. In this case, the gas barrier multilayer body (A) 10 and the gas barrier multilayer body (B) 20 are bonded so that the inorganic layer (a) 12 and the inorganic layer (b) 22 face to each other. Therefore, a stress that causes curling of the gas barrier multilayer body (A) 10 and a stress that causes curling of the gas barrier multilayer body (B) 20 are canceled by each other. Accordingly, the composite gas barrier multilayer body 100 is hardly curled.

When a stress is applied to a styrene-based thermoplastic elastomer resin, the styrene-based thermoplastic elastomer resin may be usually deformed in accordance with the stress. Therefore, for example, even when a stress is applied to the gas barrier multilayer body (A) 10 or the gas barrier multilayer body (B) 20 by bending the composite gas barrier multilayer body 100 or by applying heat shock, the layer 30 of styrene-based thermoplastic elastomer resin can be deformed to absorb the stress. Consequently, concentration of a large stress to a part of the inorganic layer (a) 12 and the inorganic layer (b) 22 can be suppressed. Thus, it is possible to prevent appearing of a crack in the inorganic layer (a) 12 and the inorganic layer (b) 22. Therefore, the gas barrier properties of the composite gas barrier multilayer body 100 can be favorably maintained. This is an excellent effect in contrast to a case in which bonding is effected using, for example, a UV curable resin as a bonding agent. The UV curable resin after curing has high hardness and cannot be deformed by the stress, and a crack in the inorganic layer (a) and the inorganic layer (b) easily occurs.

Generally, the styrene-based thermoplastic elastomer resin does not contain a remaining solvent, or even if it contains a remaining solvent, the amount of the remaining solvent is small. Thus the amount of outgas is small. Therefore, the styrene-based thermoplastic elastomer resin is unlikely to generate a gas under a low-pressure environment. Accordingly, since the composite gas barrier multilayer body itself does not act a generation source of the gas, the gas barrier properties cannot be impaired. This is an excellent effect in contrast to a case in which bonding of the gas barrier multilayer body (A) and the gas barrier multilayer body (B) is effected via, for example, an adhesive which contains a solvent and elevates the amount of the outgas.

The above-described advantage is particularly useful when the composite gas barrier multilayer body is provided in an organic photoelectric conversion element such as an organic EL device and an organic solar cell. For example, when the organic photoelectric conversion element is produced, a step of forming a layer of an organic material on a substrate which is the composite gas barrier multilayer body may be performed. In the step of forming a layer of an organic material, the temperature may largely be changed, and the substrate may be placed under a low-pressure environment. In this case, when the gas barrier multilayer body (A) and the gas barrier multilayer body (B) are bonded to each other via the layer of a styrene-based thermoplastic elastomer resin, appearing of a crack and generation of outgas are suppressed. Therefore, high gas barrier properties can be maintained.

The styrene-based thermoplastic elastomer resin is a resin containing a styrene-based thermoplastic elastomer and if necessary, an optional component other than the elastomer. The styrene-based thermoplastic elastomer is a thermoplastic elastomer having an aromatic vinyl compound unit as a structural unit of the molecule. The aromatic vinyl compound unit herein means a structural unit having a structure formed by polymerization of an aromatic vinyl compound such as styrene. The thermoplastic elastomer is a polymer having rubber elasticity at room temperature even without vulcanization, and is a polymer capable of being molded with an already existing molding machine at high temperature, like a general thermoplastic resin. The thermoplastic elastomer generally has a rubber component (i.e., soft segment) with elasticity and a molecule-restricting component (i.e., hard segment) for preventing plastic deformation in the molecule. The styrene-based thermoplastic elastomer normally has the aromatic vinyl compound unit as the hard segment.

As the styrene-based thermoplastic elastomer, an aromatic vinyl compound-conjugated diene block copolymer and a hydride thereof are preferable. The aromatic vinyl compound-conjugated diene block copolymer herein represents a block copolymer comprising a polymer block [A] containing an aromatic vinyl compound unit and a polymer block [B] containing a linear conjugated diene compound unit. The linear conjugated diene compound unit means a structural unit having a structure formed by polymerization of a linear conjugated diene compound. The block copolymer and the hydride thereof may be modified by, for example, alkoxysilane, carboxylic acid, carboxylic acid anhydride. In particular, an aromatic vinyl compound-conjugated diene block copolymer (sometimes referred to hereinbelow as "styrene-conjugated diene block copolymer" as appropriate) that is obtained by using styrene as an aromatic vinyl compound and a hydride thereof are preferred, and a hydride of a styrene-conjugated diene block copolymer is particularly preferred. The aromatic vinyl compound-conjugated diene block copolymer and the hydride thereof will be specifically described hereinbelow.

As described above, the polymer block [A] contains an aromatic vinyl compound unit. Examples of an aromatic vinyl compound corresponding to the aromatic vinyl compound unit may include styrene, α-methylstyrene, 2-methylstyrene, 3-methylstyrene, 4-methylstyrene, 2,4-diisopropylstyrene, 2,4-dimethylstyrene, 4-tert-butylstyrene, 5-tert-butyl-2-methylstyrene, 4-monochlorostyrene, dichlorostyrene, 4-monofluorostyrene, and 4-phenylstyrene. One type of them may be solely used, or two or more types thereof may be used in combination at any ratio. Among them, an aromatic vinyl compound having no polar group is preferred in terms of hygroscopicity. In terms of industrial availability and shock resistance, styrene is particularly preferred.

In the polymer block [A], the aromatic vinyl compound unit is normally a main component. Specifically, the content ratio of the aromatic vinyl compound unit in the polymer block [A] is normally 90% by weight or more, preferably 95% by weight or more, and more preferably 99% by weight or more, and normally 100% by weight or less. When the amount of the aromatic vinyl compound unit in the polymer block [A] is high as described above, the heat resistance of the composite gas barrier multilayer body can be enhanced.

The polymer block [A] may contain a component other than the aromatic vinyl compound unit. Examples of the component other than the aromatic vinyl compound unit may include a linear conjugated diene compound unit, and a structural unit having a structure formed by polymerization of a vinyl compound other than an aromatic vinyl compound.

Examples of a linear conjugated diene compound corresponding to the linear conjugated diene compound unit may include 1,3-butadiene, isoprene, 2,3-dimethyl-1,3-butadiene, and 1,3-pentadiene. One type of them may be solely used, or two or more types thereof may be used in combination at any ratio. Among them, a linear conjugated diene compound having no polar group is preferred in terms of hygroscopicity, and specifically, 1,3-butadiene and isoprene are particularly preferred.

Examples of the vinyl compound other than an aromatic vinyl compound may include a linear vinyl compound; a cyclic vinyl compound; a vinyl compound having a nitrile group, an alkoxycarbonyl group, a hydroxycarbonyl group, or a halogen group; unsaturated cyclic acid anhydrides; and a unsaturated imide compound. As the vinyl compound other than an aromatic vinyl compound, those without polar groups are preferable in terms of hygroscopicity, and examples thereof may include linear olefins such as ethylene, propylene, 1-butene, 1-pentene, 1-hexene, 1-heptene, 1-octene, 1-nonene, 1-decene, 1-dodecene, 1-eicosene, 4-methyl-1-pentene, and 4,6-dimethyl-1-heptene; and cyclic olefins such as vinylcyclohexane. Among these, linear olefins are more preferred, and ethylene and propylene are particularly preferred. One type of them may be solely used, or two or more types thereof may be used in combination at any ratio.

The content ratio of the component other than the aromatic vinyl compound unit in the polymer block [A] is normally 10% by weight or less, preferably 5% by weight or less, and more preferably 1% by weight or less, and normally 0% by weight or more.

The number of the polymer blocks [A] in one molecule of the aromatic vinyl compound-conjugated diene block copolymer is normally 2 or more, and normally 5 or less, preferably 4 or less, and more preferably 3 or less. A plurality of polymer blocks [A] may be each the same or different.

As described above, the polymer block [B] contains a linear conjugated diene compound unit. Examples of the linear conjugated diene compound unit may include the same linear conjugated diene compound unit as those that may be contained in the polymer block [A].

In the polymer block [B], the linear conjugated diene compound unit is normally a main component. Specifically, the content ratio of the linear conjugated diene compound unit in the polymer block [B] is normally 90% by weight or more, preferably 95% by weight or more, and more preferably 99% by weight or more, and normally 100% by weight or less. When the amount of the linear conjugated diene compound unit in the polymer block [B] is high as described above, the shock resistance of the composite gas barrier multilayer body at low temperature can be improved.

The polymer block [B] may contain a component other than the linear conjugated diene compound unit. Examples of the component other than the linear conjugated diene compound unit may include an aromatic vinyl compound unit, and a structural unit having a structure formed by polymerization of a vinyl compound other than an aromatic vinyl compound. Examples of the aromatic vinyl compound unit and the structural unit having a structure formed by polymerization of a vinyl compound other than an aromatic vinyl compound may include the same aromatic vinyl compound unit and the same structural unit having a structure formed by polymerization of a vinyl compound other than an aromatic vinyl compound as those that may be contained in the polymer block [A].

The content ratio of the component other than the linear conjugated diene compound unit in the polymer block [B] is normally 10% by weight or less, preferably 5% by weight or less, and more preferably 1% by weight or less, and normally 0% by weight or more. Particularly, when the content ratio of the aromatic vinyl compound unit in the polymer block, [B] is low, the flexibility of the styrene-based thermoplastic elastomer resin at low temperature can be improved, and the shock resistance of the composite gas barrier multilayer body at low temperature can be improved.

The number of polymer blocks [B] in one molecule of the aromatic vinyl compound-conjugated diene block copolymer is normally 1 or more, but may be 2 or more. When the number of polymer blocks [B] in the aromatic vinyl compound-conjugated diene block copolymer is 2 or more, the polymer blocks [B] may be the same or different.

The form of block of the aromatic vinyl compound-conjugated diene block copolymer may be a linear block or a radial block. Among them, a linear block is preferred since the mechanical strength is excellent. A particularly preferable form of the aromatic vinyl compound-conjugated diene block copolymer is a triblock copolymer in which the polymer blocks [A] are bonded to both terminals of the polymer block [B]; or a pentablock copolymer in which the polymer blocks [B] are bonded to both terminals of the polymer block [A] and other polymer blocks [A] are bonded to the other terminal of each of the polymer blocks [B].

Regarding the aromatic vinyl compound-conjugated diene block copolymer, wA represents the weight ratio of the total polymer block [A] with respect to the total aromatic vinyl compound-conjugated diene block copolymer, and wB represents the weight ratio of the total polymer block [B] with respect to the total aromatic vinyl compound-conjugated diene block copolymer. In this case, the ratio of wA to wB (wA/wB) is preferably 20/80 or more, more preferably 35/65 or more, and particularly preferably 40/60 or more, and preferably 80/20 or less, more preferably 65/35 or less, and particularly preferably 60/40 or less. When wA/wB is equal to or more than the lower limit of the range, the heat resistance of the composite gas barrier multilayer body can be improved. When wA/wB is equal to or less than the upper limit, the flexibility of the styrene-based thermoplastic elastomer resin can be enhanced, and the gas barrier properties of the composite gas barrier multilayer body 100 can be favorably maintained with stability.

When a plurality of polymer blocks [A] or polymer blocks [B] are present in one molecule, Mw(A1) and Mw(A2) represent the weight average molecular weight of a polymer block of which the weight average molecular weight is the largest and that of which the weight average molecular weight is the smallest, respectively, in the polymer block [A]. Mw(B1) and Mw(B2) represent the weight average molecular weight of a polymer block of which the weight average molecular weight is the largest and that of which the weight average molecular weight is the smallest, respectively, in the polymer block [B]. In this case, the ratio of Mw(A1) with respect to Mw(A2) "Mw(A1)/Mw(A2)" is preferably 2.0 or less, more preferably 1.5 or less, and particularly preferably 1.2 or less, and normally 1 or more.

The ratio of Mw(B1) with respect to Mw(B2) "Mw(B1)/Mw(B2)" is preferably 2.0 or less, more preferably 1.5 or less, and particularly preferably 1.2 or less, and normally 1 or more. By having such features, dispersion of various values of physical properties can be reduced.

The molecular weight of the aromatic vinyl compound-conjugated diene block copolymer is normally 30,000 or more, preferably 40,000 or more, and more preferably 50,000 or more, and normally 200,000 or less, preferably 150,000 or less, and more preferably 100,000 or less as a weight average molecular weight (Mw) in terms of polystyrene measured by GPC using tetrahydrofuran (THF) as a solvent. The molecular weight distribution (Mw/Mn) of the aromatic vinyl compound-conjugated diene block copolymer is preferably 3 or less, more preferably 2 or less, and particularly preferably 1.5 or less.

When a block copolymer having three polymer blocks is produced, examples of the method for producing an aromatic vinyl compound-conjugated diene block copolymer may include the following production methods:

(i) a production method including a first step of polymerizing a monomer mixture (a1) containing an aromatic vinyl compound as a monomer component that forms the polymer block [A]; a second step of polymerizing a monomer mixture (b1) containing a linear conjugated diene compound as a monomer component that forms the polymer block [B]; and a third step of polymerizing a monomer mixture (a2) containing an aromatic vinyl compound as the monomer component that forms the polymer block [A] (the monomer mixtures (a1) and (a2) may be the same or different); and (ii) a production method including a first step of polymerizing a monomer mixture (a1) containing an aromatic vinyl compound as a monomer component that forms the polymer block [A]; a second step of polymerizing a monomer mixture (b1) containing a linear conjugated diene compound as a monomer component that forms the polymer block [B]; and a step of coupling both terminals of the polymer block [B] using a coupling agent.

Examples of the method for polymerizing the monomer mixtures to obtain each polymer block may include radical polymerization, anionic polymerization, cationic polymerization, coordination anionic polymerization, or coordination cationic polymerization. In order to facilitate the polymerization operation and the hydrogenation reaction in subsequent steps, radical polymerization, anionic polymerization, and cationic polymerization that are performed by living polymerization are preferable, and living anionic polymerization is particularly preferable.

Each of the monomer mixtures is polymerized in the presence of a polymerization initiator at a temperature range of normally 0° C. or higher, preferably 10° C. or higher, and more preferably 20° C. or higher, and normally 100° C. or lower, preferably 80° C. or lower, and particularly preferably 70° C. or lower.

In living anionic polymerization, for example, monoorganic lithium such as n-butyllithium, sec-butyllithium, tert-butyllithium, and hexyllithium; a poly functional organic lithium compound such as dilithiomethane, 1,4-dilithiobutane, and 1,4-dilithio-2-ethylcyclohexane; may be used as the polymerization initiator. One type of them may be solely used, or two or more types thereof may be used in combination at any ratio.

The manner of polymerization reaction may be any of solution polymerization and slurry polymerization. In particular, when solution polymerization is performed, heat of reaction can easily be removed.

In solution polymerization, an inert solvent capable of dissolving a polymer that is obtained in each step is used as a solvent. Examples of the inert solvent may include aliphatic hydrocarbons such as n-pentane, isopentane, n-hexane, n-heptane, and isooctane; alicyclic hydrocarbons such as cyclopentane, cyclohexane, methylcyclopentane, methylcyclohexane, and decalin; and aromatic hydrocarbons such as benzene and toluene. One type of them may be solely used, or two or more types thereof may be used in combination at any ratio. Among them, it is preferable that an alicyclic hydrocarbon is used as the solvent since it can be used in a hydrogenation reaction as it is as the inert solvent and the solubility of the aromatic vinyl compound-conjugated diene block copolymer is favorable. The amount of the solvent to be used is normally 200 parts by weight to 2,000 parts by weight with respect to 100 parts by weight of all monomers used.

When each monomer mixture contains two or more types of monomers, for example, a randomizer may be used in order to prevent disproportionate elongation of a chain of only one component. In particular, when a polymerization reaction is performed by anionic polymerization, a Lewis base compound or the like is preferably used as the randomizer. Examples of the Lewis base compound may include ether compounds such as dimethyl ether, diethyl ether, diisopropyl ether, dibutyl ether, tetrahydrofuran, diphenyl ether, ethylene glycol diethyl ether, and ethylene glycol methyl phenyl ether; tertiary amine compounds such as tetramethyl ethylene diamine, trimethylamine, triethylamine, and pyridine; alkali metal alkoxide compounds such as potassium tert-amyloxide and potassium tert-butyloxide; and phosphine compounds such as triphenyl phosphine. One type of them may be solely used, or two or more types thereof may be used in combination at any ratio.

It is preferable that the aromatic vinyl compound-conjugated diene block copolymer is hydrogenated for use. When a hydride of the aromatic vinyl compound-conjugated diene block copolymer is used as the styrene-based thermoplastic elastomer, the amount of outgas to be generated from a styrene-based thermoplastic elastomer resin can be further reduced.

The hydride of the aromatic vinyl compound-conjugated diene block copolymer is obtained by hydrogenation of a carbon-carbon unsaturated bond in a main chain and a side chain and a carbon-carbon unsaturated bond in an aromatic ring of the aromatic vinyl compound-conjugated diene block copolymer. The hydrogenation ratio is normally 90% or more, preferably 97% or more, and more preferably 99% or more, and normally 100% or less. As the hydrogenation ratio is higher, the heat resistance and light resistance of the styrene-based thermoplastic elastomer resin can be improved. Herein, the hydrogenation ratio of the hydride may be determined by measurement through $^1$H-NMR.

The hydrogenation ratio of the carbon-carbon unsaturated bond in the main chain and the side chain is preferably 95% or more, and more preferably 99% or more, and normally 100% or less. When the hydrogenation ratio of the carbon-carbon unsaturated bond in the main chain and the side chain is increased, the light resistance and oxidation resistance of the styrene-based thermoplastic elastomer resin can be further enhanced.

The hydrogenation ratio of the carbon-carbon unsaturated bond in an aromatic ring is preferably 90% or more, more preferably 93% or more, and particularly preferably 95% or more, and normally 100% or less. When the hydrogenation ratio of the carbon-carbon unsaturated bond in an aromatic ring is increased, the glass transition temperature of the polymer block obtained by hydrogenation of the polymer block [A] increases, and therefore, the heat resistance of the composite gas barrier multilayer body can be effectively enhanced.

The hydrogenation method is not specifically limited as long as a desired hydride can be obtained. A hydrogenation method capable of increasing the hydrogenation ratio and reducing a chain scission reaction of the block copolymer is preferred. Examples of such a preferable hydrogenation method may include a method using a hydrogenation catalyst containing at least one metal selected from the group consisting of nickel, cobalt, iron, titanium, rhodium, palladium, platinum, ruthenium, and rhenium. As the hydrogenation catalyst, any of a heterogeneous catalyst and a homogeneous catalyst may be used. It is preferable that the hydrogenation reaction is performed in an organic solvent.

As the heterogeneous catalyst, a metal or a metal compound as it is may be used. Alternatively, the catalyst supported on a suitable carrier may also be used. Examples of the carrier may include activated carbon, silica, alumina, calcium carbonate, titania, magnesia, zirconia, diatomaceous earth, silicon carbide, and calcium fluoride. The amount of the supported catalyst is normally 0.1% by weight or more, and preferably 1% by weight or more, and normally 60% by weight or less, and preferably 50% by weight or less with respect to the total amount of the catalyst and the carrier. The specific surface area of a supported type catalyst is preferably 100 m$^2$/g to 500 m$^2$/g. The average micropore diameter of the supported type catalyst is preferably 100 Å or larger, and more preferably 200 Å or larger, and preferably 1,000 Å or smaller, and more preferably 500 Å or smaller. The specific surface area herein is determined by measuring the nitrogen adsorption amount and using a BET equation. The average micropore diameter may be measured through a mercury penetration method.

As the homogeneous catalyst, for example, a catalyst including a compound of nickel, cobalt, titanium, or iron in combination with an organometallic compound; an organometallic complex catalyst of rhodium, palladium, platinum, ruthenium, or rhenium may be used.

Examples of the compound of nickel, cobalt, titanium, or iron may include acetylacetonate compounds, carboxylate salts, and cyclopentadienyl compounds of each of the metals.

Examples of the organometallic compound may include organoaluminum compounds including alkyl aluminum such as triethyl aluminum and triisobutyl aluminum, halogenated aluminum such as diethyl aluminum chloride and ethyl aluminum dichloride, and hydrogenated alkyl aluminum such as diisobutyl aluminum hydride; and organolithium compounds.

Examples of the organometallic complex catalyst may include transition metal complexes such as dihydride-tetrakis(triphenylphosphine)ruthenium, dihydride-tetrakis(triphenylphosphine)iron, bis(cyclooctadiene)nickel, and bis(cyclopentadienyl)nickel.

As the hydrogenation catalyst, one type thereof may be solely used, or two or more types thereof may be used in combination at any ratio.

The amount of the hydrogenation catalyst to be used is normally 0.01 parts by weight or more, preferably 0.05 parts by weight or more, and more preferably 0.1 parts by weight or more, and normally 100 parts by weight or less, preferably 50 parts by weight or less, and more preferably 30 parts by weight or less, with respect to 100 parts by weight of the aromatic vinyl compound-conjugated diene block copolymer.

The temperature of the hydrogenation reaction is normally 10° C. or higher, preferably 50° C. or higher, and more preferably 80° C. or higher, and normally 250° C. or lower, preferably 200° C. or lower, and more preferably 180° C. or lower. When the temperature falls within this range, the hydrogenation ratio increases, and molecule scission is reduced. The hydrogen pressure during the hydrogenation reaction is normally 0.1 MPa or higher, preferably 1 MPa or higher, and more preferably 2 MPa or higher, and normally 30 MPa or lower, preferably 20 MPa or lower, and more preferably 10 MPa or lower. When the hydrogen pressure falls within this range, the hydrogenation ratio increases, molecular chain scission is reduced, and operability is excellent.

The hydrogenation catalyst and a polymerization catalyst are removed from a reaction solution containing a hydride by a method such as filtration or centrifugation, and the hydride of the aromatic vinyl compound-conjugated diene block copolymer obtained by the above-described method is then collected from the reaction solution. Examples of the method for collecting the hydride from the reaction solution may include a steam solidification method of removing a solvent from a solution in which a hydride is dissolved by steam stripping; a direct desolvating method of removing a solvent by heating under reduced pressure; and a solidification method in which a solution is added to a poor solvent of a hydride, resulting in precipitation and solidification.

The form of the hydride of the aromatic vinyl compound-conjugated diene block copolymer collected is not limited, but is normally a pellet shape since it is easily subjected to later molding processing or modification reaction. If the hydride is collected from the reaction solution by the direct desolvating method, for example, the hydride in a molten state may be extruded from a dice into a strand shape, cooled, cut with a pelletizer into a pellet shape, and molded into various shapes. If the solidification method is used, for example, the resulting coagulation may be dried, extruded in a molten state with an extruder, cut into a pellet shape as described above, and molded into various shapes or subjected to a modification reaction.

The molecular weight of the hydride of the aromatic vinyl compound-conjugated diene block copolymer is normally 30,000 or more, preferably 40,000 or more, and more preferably 45,000 or more, and normally 200,000 or less, preferably 150,000 or less, and more preferably 100,000 or less as a weight average molecular weight (Mw) in terms of polystyrene measured by gel permeation chromatography (GPC) using tetrahydrofuran as a solvent. The molecular weight distribution (Mw/Mn) of the hydride of the aromatic vinyl aromatic compound-conjugated diene block copolymer is preferably 3 or less, more preferably 2 or less, and particularly preferably 1.5 or less. When the molecular weight and molecular weight distribution of the hydride fall within the ranges, the mechanical strength and heat resistance of the composite gas barrier multilayer body can be improved.

Examples of the optional component that may be contained in the styrene-based thermoplastic elastomer resin may include a light stabilizer, a ultraviolet absorber, an antioxidant, a slip additive, and an inorganic filler, which are used for improving the weather resistance and heat resistance. One type of them may be solely used, or two or more types thereof may be used in combination at any ratio.

It is preferable that the light stabilizer is a hindered amine light stabilizer, and particularly preferably a compound having a 3,5-di-tert-butyl-4-hydroxyphenyl group, a 2,2,6,6-tetramethylpiperidyl group, or a 1,2,2,6,6-pentamethyl-4-piperidyl group in the structure.

Specific examples of the light stabilizer may include mixed ester compounds of 1,2,3,4-butanetetracarboxylic acid, 1,2,2,6,6-pentamethyl-4-piperidinol and 3,9-bis(2-hydroxy-1,1-dimethylethyl)-2,4,8,10-tetraoxaspiro[5,5] undecane, polycondensate of 1,6-hexanediamine-N,N'-bis(2,2,6,6-tetramethyl-4-piperidyl) and morpholine-2,4,6-trichloro-1,3,5-triazine, 1-[2-[3-(3,5-di-tert-butyl-4-hydroxyphenyl)propionyloxy]ethyl]-4-[3-3,5-di-tert-butyl-4-hydroxyphenyl)propionyloxy]-2,2,6,6-tetramethylpiperidine, 2-(3,5-di-tert-butyl-4-hydroxybenzyl)-2-n-butylmalonic acid-bis(1,2,2,6,6-pentamethyl-4-piperidyl), 2-(3,5-di-tert-butyl-4-hydroxybenzyl)-2-n-butylmalonic acid-bis(1,2,2,6,6-pentamethyl-4-piperidyl), 4-(3-(3,5-di-tert-butyl-4-hydroxyphenyl)propionyloxy)-1-(2-(3-(3,5-di-tert-butyl-4-hydroxyphenyl)propionyloxy)ethyl)-2,2,6,6-tetramethylpiperidine, 4-(N-(1-benzyl-2-phenylethyl)-N-formylamino)-2,2,6,6-tetramethylpiperidine, 4-(N-(2-(1-pyrrolidyl)ethyl)-N-formylamino)-2,2,6,6-tetramethylpiperidine, 4-(N-(2-(4-morpholinyl)ethyl)-N-formylamino)-2,2,6,6-tetramethyl-N-methylpiperidine, 4-(N-(2-(4-morpholinyl)ethyl)-N-formylamino)-2,2,6,6-tetramethylpiperidine, 4-(N-(2-(diisopropylamino)ethyl)-N-formylamino)-2,2,6,6-tetramethylpiperidine, 4-(N-(2,4,6-trimethylbenzyl)-N-formylamino)-2,2,6,6-tetramethylpiperidine, 4-(N-(3-(2-ethylhexoxy)propyl)-N-formylamino)-2,2,6,6-tetramethylpiperidine, 4-(N-(3,4-(methylenedioxy)benzyl)-N-formylamino)-2,2,6,6-tetramethylpiperidine, 4-(N-(bicyclo[2.2.1]heptyl)-N-formylamino)-2,2,6,6-tetramethylpiperidine, 4-(N-1,2,2-trimethylpropyl-N-formylamino)-2,2,6,6-tetramethylpiperidine, 4-(N-1,3-dimethylbutyl-N-formylamino)-2,2,6,6-tetramethylpiperidine, 4-(N-1-benzylethyl-N-formylamino)-2,2,6,6-tetramethylpiperidine, 4-(N-2,2-dimethylpropyl-N-formylamino)-2,2,6,6-tetramethylpiperidine, 4-(N-2-ethylhexyl-N-formylamino)-2,2,6,6-tetramethylpiperidine, 4-(N-3-methylbutyl-N-formylamino)-2,2,6,6-tetramethylpiperidine, 4-(N-4-hydroxybutyl-N-formylamino)-2,2,6,6-tetramethylpiperidine, 4-(N-4-hydroxybutyl-N-formylamino)-2,2,6,6-tetramethylpiperidine, 4-(N-i-propyl-N-formylamino)-2,2,6,6-tetramethylpiperidine, 4-(N-i-propyl-N-formylamino)-2,2,6,6-tetramethylpiperidine, 4-(N-tert-butyl-N-formylamino)-2,2,6,6-tetramethylpiperidine, 4-(N-isopropylbenzyl-N-formylamino)-2,2,6,6-tetramethylpiperidine, 4-(N-ethoxyethyl-N-formylamino)-2,2,6,6-tetramethylpiperidine, 4-(N-ethoxypropyl-N-formylamino)-2,2,6,6-tetramethylpiperidine, 4-(N-octadecyl-N-formylamino)-2,2,6,6-tetramethylpiperidine, 4-(N-octyl-N-formylamino)-2,2,6,6-tetramethyl-N-methylpiperidine, 4-(N-octyl-N-formylamino)-2,2,6,6-tetramethylpiperidine, 4-(N-chlorobenzyl-N-formylamino)-2,2,6,6-tetramethylpiperidine, 4-(N-diethylaminoethyl-N-formylamino)-2,2,6,6-tetramethylpiperidine, 4-(N-cyclododecyl-N-formylamino)-2,2,6,6-tetramethylpiperidine, 4-(N-cyclohexyl-N-formylamino)-2,2,6,6-tetramethyl-N-methylcarbonylpiperidine, 4-(N-cyclohexyl-N-formylamino)-2,2,6,6-tetramethyl-N-methylpiridine, 4-(N-cyclohexyl-N-formylamino)-2,2,6,6-tetramethylpiridine, 4-(N-cyclopentyl-N-formylamino)-2,2,6,6-tetramethyl-N-methylpiperidine, 4-(N-cyclopentyl-N-formylamino)-2,2,6,6-tetramethylpiperidine, 4-(N-dimethylaminopropyl-N-formylamino)-2,2,6,6-tetramethylpiperidine, 4-(N-decyl-N-formylamino)-2,2,6,6-tetramethyl-N-methylpiperidine, 4-(N-decyl-N-formylamino)-2,2,6,6-tetramethylpiperidine, 4-(N-dodecyl-N-formylamino)-2,2,6,6-tetramethylpiperidine, 4-(N-pyridinylmethyl-N-formylamino)-2,2,6,6-tetramethylpiperidine, 4-(N-phenylethyl-N-formylamino)-2,2,6,6-tetramethyl-N-methylpiridine, 4-(N-phenylethyl-N-formylamino)-2,2,6,6-tetramethylpiridine, 4-(N-butyl-N-formylamino)-2,2,6,6-tetramethyl-N-methylpiperidine, 4-(N-butyl-N-formylamino)-2,2,6,6-tetramethyl-N-methyl-piperidine, 4-(N-fluorobenzyl-N-formylamino)-2,2,6,6-tetramethylpiperidine, 4-(N-hexyl-N-formylamino)-2,2,6,6-tetramethyl-N-methylpiperidine, 4-(N-hexyl-N-formylamino)-2,2,6,6-tetramethylpiperidine, 4-(N-pentyl-N-formylamino)-2,2,6,6-tetramethyl-N-methylpiperidine, 4-(N-pentyl-N-formylamino)-2,2,6,6-tetramethylpiperidine, 4-(N-methylcyclohexyl-N-formylamino)-2,2,6,6-tetramethylpiridine, 4-(N-methylbenzyl-N-formylamino)-2,2,6,6-tetramethylpiperidine, 4-(N-methoxybenzyl-N-formylamino)-2,2,6,6-tetramethylpiperidine, 4-(formylamino)-2,2,6,6-tetramethyl-N-methylpiperidine, 4-(formylamino)-2,2,6,6-tetramethylpiperidine, 4-[N-(2,2,6,6-tetramethyl-4-piperidyl)-N-formylamino]-2,2,6,6-tetramethyl-N-methylpiridine, 4-[N-(2,2,6,6-tetramethyl-4-piperidyl)-N-formylamino]-2,2,6,6-tetramethylpiridine, N,N',N'',N'''-tetrakis-(4,6-bis(butyl-(N-methyl-2,2,6,6-tetramethylpiperidin-4-yl)amino)-triazin-2-yl)-4,7-diazadecane-1,10-amine, N,N'-bis(2,2,6,6-tetramethyl-4-N-methylpiperidyl)-N,N'-diformyl-1,4-xylylenediamine, N,N'-bis(2,2,6,6-tetramethyl-4-N-methylpiperidyl)-N,N'-diformyl-trimethylenediamine, N,N'-bis(2,2,6,6-tetramethyl-4-N-methylpiperidyl)-N,N'-diformyl-hexamethylenediamine, N,N'-bis(2,2,6,6-tetramethyl-4-N-methylpiperidyl)-N,N'-diformyl-ethylenediamine, N,N'-bis(2,2,6,6-tetramethyl-4-piperidyl)-N,N'-diformyl-1,4-xylylenediamine, N,N'-bis(2,2,6,6-tetramethyl-4-piperidyl)-N,N'-diformylethylenediamine, N,N'-bis(2,2,6,6-tetramethyl-4-piperidyl)-N,N'-diformyl-trimethylenediamine, N,N'-bis(2,2,6,6-tetramethyl-4-piperidyl)-N,N'-diformylhexamethylenediamine, N,N'-bis(2,2,6,6-tetramethyl-4-piperidyl)-N,N'-bishexamethyleneacrylic acid amide, N,N'-bis(2,2,6,6-tetramethyl-4-piperidyl)-N,N'-bishexamethylenearachic acid amide, N,N'-bis(2,2,6,6-tetramethyl-4-piperidyl)-N,N'-bishexamethyleneangelic acid amide, N,N'-bis(2,2,6,6-tetramethyl-4-piperidyl)-N,N'-bishexamethyleneundecylic acid amide, N,N'-bis(2,2,6,6-tetramethyl-4-piperidyl)-N,N'-bishexamethyleneundecylenic acid amide, N,N'-bis(2,2,6,6,-tetramethyl-4-piperidyl)-N,N'-bishexamethyleneoleic acid amide, N,N'-bis(2,2,6,6-tetramethyl-4-piperidyl)-N,N'-bishexamethylenegadoleic acid amide, N,N'-bis(2,2,6,6-tetramethyl-4-piperidyl)-N,N'-bishexamethylenecaprylic acid amide, N,N'-bis(2,2,6,6-tetramethyl-4-piperidyl)-N,N'-bishexamethylenecapric acid amide, N,N'-bis(2,2,6,6-tetramethyl-4-piperidyl)-N,N'-bishexamethylenecaproic acid amide, N,N'-bis(2,2,6,6-tetramethyl-4-piperidyl)-N,N'-bishexamethylenecrotonic acid amide, N,N'-bis(2,2,6,6-tetramethyl-4-piperidyl)-N,N'-bishexamethylenecitronellic acid amide, N,N'-bis(2,2,6,6-tetramethyl-4-piperidyl)-N,N'-bishexamethylenestearic acid amide, N,N'-bis(2,2,6,6-tetramethyl-4-piperidyl)-N,N'-bishexamethylenezoomaric acid amide, N,N'-bis(2,2,6,6-tetramethyl-4-piperidyl)-N,N'-bishexamethylenetridecylic acid amide, N,N'-bis(2,2,6,6-tetramethyl-4-piperidyl)-N,N'-bishexamethylenenonadecylic acid amide, N,N'-bis(2,2,6,6-tetramethyl-4-piperidyl)-N,N'-bishexamethylenepalmitic acid amide, N,N'-bis(2,2,6,6-tetramethyl-4-piperidyl)-N,N'-bishexamethylenebrenzterebic acid amide, N,N'-bis(2,2,6,6-tetramethyl-4-piperidyl)-N,N'-bishexamethylenepropionic acid amide, N,N'-bis(2,2,6,6-tetramethyl-4-piperidyl)-N,N'-bishexamethyleneheptanoic acid amide, N,N'-bis(2,2,6,6-tetramethyl-4-piperidyl)-N,N'-bishexamethylenebehenic acid amide, N,N'-bis(2,2,6,6-tetramethyl-4-piperidyl)-N,N'-bishexamethylenepelargonic acid amide, N,N'-bis(2,2,6,6-tetramethyl-4-piperidyl)-N,N'-bishexamethylenepentadecylic acid amide, N,N'-bis(2,2,6,6-tetramethyl-4-piperidyl)-N,N'-bishexamethylenemargaric acid amide, N,N'-bis(2,2,6,6-tetramethyl-4-piperidyl)-N,N'-bishexamethylenemyristic acid amide, N,N'-bis(2,2,6,6-tetramethyl-4-piperidyl)-N,N'-bishexamethylenelauric acid amide, N,N'-bis(2,2,6,6-tetramethyl-4-piperidyl)-N,N'-bishexamethylenelinderic acid amide, N,N'-bis(2,2,6,6-tetramethyl-4-piperidyl)-N,N'-bishexamethylenevaleric acid amide, N,N'-bis(2,2,6,6-tetramethyl-4-piperidyl)-N,N'-bishexamethyleneacetic acid amide, N,N'-bis(2,2,6,6-tetramethyl-4-piperidyl)-N,N'-bishexamethylenetetradecenoic acid amide, N,N'-bis(2,2,6,6-tetramethyl-4-piperidyl)-N,N'-bishexamethylenebutyric acid amide, a polymer of dimethyl succinate and 4-hydroxy-2,2,6,6-tetramethyl-1-piperidine ethanol, a polycondensate of dibutylamine, 1,3,5-triazine and N,N'-bis(2,2,6,6-tetramethyl-4-piperidyl)butylamine, bis(1,2,2,6,6-pentamethyl-4-piperidyl)-2-(3,5-di-tert-butyl-4-hydroxybenzyl)-2-n-butyl malonate, bis(2,2,6,6-tetramethyl-4-piperidyl) sebacate, poly[[6-morpholino-s-triazin-2,4-diyl] [(2,2,6,6-tetramethyl-4-piperidyl)imino]-hexamethylene[(2,2,6,6-tetramethyl-4-piperidyl)imino], poly[{1,1,3,3-tetramethylbutyl)amino-1,3,5-triazin-2,4-diyl}{(2,2,6,6-tetramethyl-4-piperidyl)imino}hexamethylene{(2,2,6,6-tetramethyl-4-piperidyl)imino}], poly[{6-(1,1,3,3-tetramethylbutyl)amino-1,3,5-triazin-2,4-diyl}{(2,2,6,6-tetramethyl-4-piperidyl)imino}hexamethylene{(2,2,6,6-tetramethyl-4-piperidyl)imino}], and reaction products of a polymer of N,N'-bis(2,2,6,6-tetramethyl-4-piperidinyl)-1,6-hexanediamine and 2,4,6-trichloro-1,3,5-triazine with N-butyl-1-butaneamine and N-butyl-2,2,6,6-tetramethyl-4-piperidineamine.

Among them, in terms of excellent weather resistance, N,N'-bis(2,2,6,6-tetramethyl-4-N-methylpiperidyl)-N,N'-diformyl-alkylenediamines, N,N'-bis(2,2,6,6-tetramethyl-4-piperidyl)-N,N'-diformyl-alkylenediamines, N,N'-bis(2,2,6,6-tetramethyl-4-piperidyl)-N,N'-bisalkylene fatty acid amides, and poly[{6-(1,1,3,3-tetramethylbutyl)amino-1,3,5-triazin-2,4,diyl}{(2,2,6,6,-tetramethyl-4-piperidyl)imino}hexamethylene{(2,2,6,6-tetramethyl-4-piperidyl)imino}] are preferred, and N,N'-bis(2,2,6,6-tetramethyl-4-piperidyl)-N,N'-diformyl-alkylenediamines, and a reaction product of a polymer of N,N'-bis(2,2,6,6-tetramethyl-4-piperidinyl)-1,6-hexanediamine and 2,4,6-trichloro-1,3,5-triazine with N-butyl-1-butaneamine and N-butyl-2,2,6,6-tetramethyl-4-piperidineamine are particularly preferred.

The amount of the light stabilizer is normally 0.01 parts by weight or more, preferably 0.02 parts by weight or more, and more preferably 0.03 parts by weight or more, and normally 5 parts by weight or less, preferably 2 parts by weight or less, and more preferably 1 part by weight or less, with respect to 100 parts by weight of the styrene-based thermoplastic elastomer. When the amount of the light stabilizer is equal to or more than the lower limit of the range, the weather resistance can be enhanced. When the amount of the light stabilizer is equal to or less than the upper limit, a T-die and a cooling roller in an extruder can be prevented from being polluted during a melt molding process in which the styrene-based thermoplastic elastomer resin is molded into a film shape, and the processability can be enhanced.

Examples of the ultraviolet absorber may include a benzophenone-based ultraviolet absorber, a salicylic acid-based ultraviolet absorber, and a benzotriazole-based ultraviolet absorber.

Examples of the benzophenone-based ultraviolet absorber may include 2,4-dihydroxybenzophenone, 2-hydroxy-4-methoxybenzophenone, 2-hydroxy-4-methoxybenzophenone-5-sulfonic acid trihydrate, 2-hydroxy-4-octyloxybenzophenone, 4-dodecaloxy-2-hydroxybenzophenone, 4-benzyloxy-2-hydroxybenzophenone, 2,2',4,4'-tetrahydroxybenzophenone, and 2,2'-dihydroxy-4,4'-dimethoxybenzophenone.

Examples of the salicylic acid-based ultraviolet absorber may include phenyl salicylate, 4-tert-butylphenyl-2-hydroxybenzoate, phenyl-2-hydroxybenzoate, 2,4-di-tert-butylphenyl-3,5-di-tert-butyl-4-hydroxybenzoate, and hexadecyl-3,5-di-tert-butyl-4-hydroxybenzoate.

Examples of the benzotriazole-based absorber may include 2-(2-hydroxy-5-methylphenyl)2H-benzotriazole, 2-(3-tert-butyl-2-hydroxy-5-methylphenyl)-5-chloro-2H-benzotriazole, 2-(3,5-di-tert-butyl-2-hydroxyphenyl)-5-chloro-2H-benzotriazole, 2-(3,5-di-tert-butyl-2-hydroxyphenyl)-2H-benzotriazole, 5-chloro-2-(3,5-di-tert-butyl-2-hydroxyphenyl)-2H-benzotriazole, 2-(3,5-di-tert-amyl-2-hydroxyphenyl)-2H-benzotriazole, 2-(2-hydroxy-5-tert-octylphenyl)-2H-benzotriazole, 2-(2-hydroxy-4-octylphenyl)-2H-benzotriazole, 2-(2H-benzotriazol-2-yl)-4-methyl-6-(3,4,5,6-tetrahydrophthalimidylmethyl)phenol, and 2,2'-methylenebis[4-(1,1,3,3-tetramethylbutyl)-6-[(2H-benzotriazol-2-yl)phenol]].

The amount of the ultraviolet absorber is normally 0.01 parts by weight or more, preferably 0.02 parts by weight or more, and more preferably 0.04 parts by weight or more, and normally 1 part by weight or less, preferably 0.5 parts by weight or less, and more preferably 0.3 parts by weight or less, with respect to 100 parts by weight of the styrene-based thermoplastic elastomer. When the ultraviolet absorber is used in an amount equal to or more than the lower limit of this range, the light resistance can be improved. When the ultraviolet absorber is used in an excessive amount exceeding the upper limit, further improvement is hardly achieved.

Examples of the antioxidant may include a phosphorus-based antioxidant, a phenol-based antioxidant, and a sulfur-based antioxidant. Phosphorus-based antioxidant is preferred because of its higher ability to suppress coloring.

Examples of the phosphorus-based antioxidant may include monophosphite-based compounds such as triphenylphosphite, diphenylisodecylphosphite, phenyldiisodecylphosphite, tris(nonylphenyl)phosphite, tris(dinonylphenyl)phosphite, tris(2,4-di-tert-butylphenyl)phosphite, and 10-(3,5-di-tert-butyl-4-hydroxybenzyl)-9,10-dihydro-9-oxa-10-phosphaphenanthrene-10-oxide; diphosphite-based compounds such as 4,4'-butylidene-bis(3-methyl-6-tert-butylphenyl-di-tridecylphosphite) and 4,4'-isopropylidene-bis(phenyl-di-alkyl(C12-C15)phosphite); and compounds such as 6-[3-(3-tert-butyl-4-hydroxy-5-methylphenyl)propoxy]-2,4,8,10-tetrakis-tert-butyldibenz[d,f][1.3.2]dioxaphosphepine and 6-[3-(3,5-di-tert-butyl-4-hydroxyphenyl)propoxy]-2,4,8,10-tetrakis-tert-butyldibenz[d,f][1.3.2]dioxaphosphepine.

Examples of the phenol-based antioxidant may include compounds such as pentaerythrityl tetrakis[3-(3,5-di-tert-butyl-4-hydroxyphenyl)propionate], 2,2-thio-diethylenebis[3-(3,5-di-tert-butyl-4-hydroxyphenyl)propionate], octadecyl-3-(3,5-di-tert-butyl-4-hydroxyphenyl)propionate, 3,9-bis{2-[3-(3-tert-butyl-4-hydroxy-5-methylphenyl) propionyloxy]-1,1-dimethylethyl}-2,4,8,10-tetraoxaspiro[5,5]undecane, and 1,3,5-trimethyl-2,4,6-tris(3,5-di-tert-butyl-4-hydroxybenzyl)benzene.

Examples of the sulfur-based antioxidant may include compounds such as dilauryl-3,3'-thiodipropionate, dimyristyl-3,3'-thiodipropipionate, distearyl-3,3'-thiodipropionate, laurylstearyl-3,3'-thiodipropionate, pentaerythritol-tetrakis (β-lauryl-thio-propionate), and 3,9-bis(2—dodecylthio-ethyl)-2,4,8,10-tetraoxaspiro[5,5] undecane.

The amount of the antioxidant is normally 0.01 parts by weight or more, preferably 0.05 parts by weight or more, and more preferably 0.1 parts by weight or more, and normally 1 part by weight or less, preferably 0.5 parts by weight or less, and more preferably 0.3 parts by weight or less, with respect to 100 parts by weight of the styrene-based thermoplastic elastomer. When the antioxidant is used in an amount equal to or more than the lower limit of this range, the thermal stability can be improved. When the antioxidant is used in an excessive amount exceeding the upper limit, further improvement is hardly achieved.

Examples of a method of mixing the styrene-based thermoplastic elastomer and the optional component may include a method in which the optional component is dissolved in an appropriate solvent, and mixed in a solution of the styrene-based thermoplastic elastomer, and the solvent is removed to collect a styrene-based thermoplastic elastomer resin containing the optional component; and a method in which the styrene-based thermoplastic elastomer is brought into a molten state using a biaxial kneader, a roller, Brabender, an extruder, or the like, and is kneaded with the optional component.

The styrene-based thermoplastic elastomer resin is not necessarily limited to a styrene-based thermoplastic elastomer resin having high transparency. However, in order to obtain the composite gas barrier multilayer body that is useful for use in a portion that is required to transmit light in, for example, a display device, a light source device, or a solar cell, it is preferable that the styrene-based thermoplastic elastomer resin has high transparency. For example, it is preferable that the total light transmittance of the styrene-based thermoplastic elastomer resin measured using a test peace having a thickness of 1 mm of the styrene-based thermoplastic elastomer resin is normally 70% or higher, preferably 80% or higher, and more preferably 90% or higher, and normally 100% or lower.

The thickness of the layer of the styrene-based thermoplastic elastomer resin is preferably 10 μm or more, more preferably 15 μm or more, and particularly preferably 20 μm or more, and preferably 150 μm or less, more preferably 120 μm or less, and particularly preferably 100 μm or less. When the thickness of the layer of the styrene-based thermoplastic elastomer resin is equal to or more than the lower limit of the range, a film of the styrene-based thermoplastic elastomer resin can be produced by an extrusion method. Even if the styrene-based thermoplastic elastomer resin having a thickness of this range is contaminated with a small heterogeneous object, the layer of the styrene-based thermoplastic elastomer can be prevented from being made nonuniform due to the heterogeneous object. When the thickness is equal to or less than the upper limit, deflection after bonding can be suppressed to form a uniform composite gas barrier multilayer body, and the thickness of the composite gas barrier multilayer body can be decreased.

The layer of the styrene-based thermoplastic elastomer resin is usually prepared as a long-length film, and the film is used in production of the composite gas barrier multilayer body. The method for producing a film of the styrene-based thermoplastic elastomer resin is not particularly limited, and for example, a melt molding method or a solution casting method may be used. For example, the melt molding method may be specifically classified into an extrusion molding method, a press molding method, an inflation molding method, an injection molding method, a blow molding method, and a stretch molding method. Among these methods, the extrusion molding method, the inflation molding method, and the press molding method are preferred since the film that has excellent mechanical strength and surface precision can be obtained, and the extrusion molding method is particularly preferred in terms of efficient and simple production of the film.

[5. Optional Layer]

In addition to the above-described components, the composite gas barrier multilayer body may have an optional component, if necessary.

For example, a blocking preventing layer may be formed on one outside surface of the composite gas barrier multilayer body. When the blocking preventing layer is formed, blocking of the composite gas barrier multilayer body can be prevented. In addition, the surface of the composite gas barrier multilayer body can be protected during storage or transportation of the composite gas barrier multilayer body. The blocking preventing layer may be formed by, for example, a method of applying a release agent such as a silicone-based release agent, a long-chain alkyl-based release agent, a fluorine-based release agent, and molybdenum sulfide; a method of forming a resin layer containing a slip additive such as inactive particles.

The outside surface of the composite gas barrier multilayer body normally corresponds to a surface of the film (a) or the film (b) opposite to the inorganic layer (a) or the inorganic layer (b). Therefore, the blocking preventing layer is normally formed on the surface of the film (a) or the film (b) opposite to the inorganic layer (a) or the inorganic layer (b). Blocking is likely to occur before the inorganic layer (a) or the inorganic layer (b) is formed on the surface of the film (a) or the film (b). Therefore, it is preferable that a step of forming the blocking preventing layer is performed before a step of forming the inorganic layer (a) or the inorganic layer (b) on the surface of the film (a) or the film (b).

The composite gas barrier multilayer body may have, for example, an antistatic layer, a hardcoat layer, a conductivity-imparting layer, a fouling preventing layer, a concavo-convex structural layer. Among them, the conductivity-imparting layer may be formed by patterning through printing or etching. Such an optional layer may be formed by, for example, a method of applying a material for the optional layer to the film (a) or the film (b), followed by curing; or a thermo-compression bonding method.

[6. Physical Properties of Composite Gas Barrier Multilayer Body]

The moisture vapor transmission rate of the entire composite gas barrier multilayer body is preferably $1 \times 10^{-2}$ g/m²·day or less, and more preferably $1 \times 10^{-3}$ g/m²·day or less. The lower limit thereof is ideally zero, but is practically $1 \times 10^{-6}$ g/m²·day or more. Such a moisture vapor transmission rate may be achieved by appropriately selecting the materials and the thicknesses of the inorganic layer and the other layers.

Even when the composite gas barrier multilayer body is under a high-temperature environment, the gas barrier properties are hardly impaired. Specifically, even when the composite gas barrier multilayer body is left under an environment of 150° C. for 1 hour, the moisture vapor transmission rate can be usually within a low range as described above. Even when the composite gas barrier multilayer body is left under a low-pressure environment, the amount of outgas to be generated is usually small. Thus, the composite gas barrier multilayer body has high gas barrier properties, and the gas barrier properties can be favorably maintained under a high-temperature or low-pressure environment. Therefore, the composite gas barrier multilayer body has excellent weather resistance.

The composite gas barrier multilayer body is hardly curled. Therefore, the curl amount that is determined by the following measurement method can be normally decreased to 1 mm or less.

Herein, the curl amount may be measured by the following method. A sample is first punched into a 5-cm square. The punched sample piece is disposed on a horizontal board. At this time, the sample piece is disposed so that a concave curl is formed vertically upward. Distances of four points in respective corners of the disposed sample piece from the board are measured. The average value of the measured distances at the four points is calculated as the curl amount.

In the composite gas barrier multilayer body, the adhesion force between the gas barrier multilayer body (A) and the gas barrier multilayer body (B) immediately after the completion of manufacturing is preferably 1.0 N/cm or more, and more preferably 2.0 N/cm or more. It is preferable that the difference between the adhesion force immediately after the completion of manufacturing and the adhesion force after exposure to high temperature and high humidity is preferably 0% or more and 10% or less.

The composite gas barrier multilayer body is pliable and has excellent flexibility. For this reason, even when the composite gas barrier multilayer body is bent, crack does not easily appear. Therefore, the gas barrier properties are unlikely to be reduced by external force.

The transparency of the composite gas barrier multilayer body is not particularly limited. However, the total light transmittance of the composite gas barrier multilayer body is preferably 70% or more, more preferably 80% or more, and particularly preferably 90% or more, and normally 100% or less since thereby the composite gas barrier multilayer body can be advantageously used in a portion that is required to transmit light in, for example, a display device, a light source device, or a solar cell.

The haze of the entire composite gas barrier multilayer body is not particularly limited. When the composite gas barrier multilayer body is used for an optical use where light diffusion is not especially intended, it is generally preferable that the haze is low. The haze is preferably 3.0% or less, more preferably 1.0% or less, and normally 0% or more.

[7. Method for Producing Composite Gas Barrier Multilayer Body]

The composite gas barrier multilayer body can be produced by, for example, a method including steps of forming the inorganic layer (a) on at least one surface of the film (a) to obtain the gas barrier multilayer body (A), forming the inorganic layer (b) on at least one surface of the film (b) to obtain the gas barrier multilayer body (B); and stacking the gas barrier multilayer body (A), the gas barrier multilayer body (B), and a film (c) of the styrene-based thermoplastic elastomer resin so that the film (a), the inorganic layer (a), the film (c), the inorganic layer (b), and the film (b) are layered in this order, and then thermally compression-bonding the stack.

According to the method of bonding the gas barrier multilayer body (A) having the inorganic layer (a) and the gas barrier multilayer body (B) having the inorganic layer (b), a composite gas barrier multilayer body that has high gas barrier properties and is unlikely to be curled can be easily produced. For example, in order to produce a composite gas barrier multilayer body having a plurality of inorganic layers, a method of repeating a process such as sputtering to a film to form a plurality of inorganic layers is considered. However, formation of a plurality of inorganic layers by such a process as sputtering to one film is difficult in terms of production step. On the other hand, according the method of bonding a plurality of gas barrier multilayer bodies having an inorganic layer, a composite gas barrier multilayer body having a plurality of inorganic layers is easily produced. In particular, this is effective in terms of enhancement of production efficiency since the number of process at low pressure, such as sputtering, can be decreased.

Since the gas barrier multilayer body (A) and the gas barrier multilayer body (B) are bonded by the film (c) of the styrene-based thermoplastic elastomer resin, the bonding is facilitated. For example, when the gas barrier multilayer body (A) and the gas barrier multilayer body (B) are bonded via a fluid bonding agent, it is difficult to uniformly bond the gas barrier multilayer body (A) and the gas barrier multilayer body (B). This is because the gas barrier multilayer body (A) and the gas barrier multilayer body (B) are each independently likely to be curled. On the other hand, when the styrene-based thermoplastic elastomer resin formed into a film shape is used for bonding, bonding is facilitated and the composite gas barrier multilayer body can be stably produced.

The method of forming the inorganic layer (a) and the inorganic layer (b) on surfaces of the film (a) and the film (b), respectively, is as described in section of inorganic layer (a). The gas barrier multilayer body (A) and the gas barrier multilayer body (B) are normally produced in a long-length film shape, and wound up into a roll shape for use in the next step.

Figure 2:
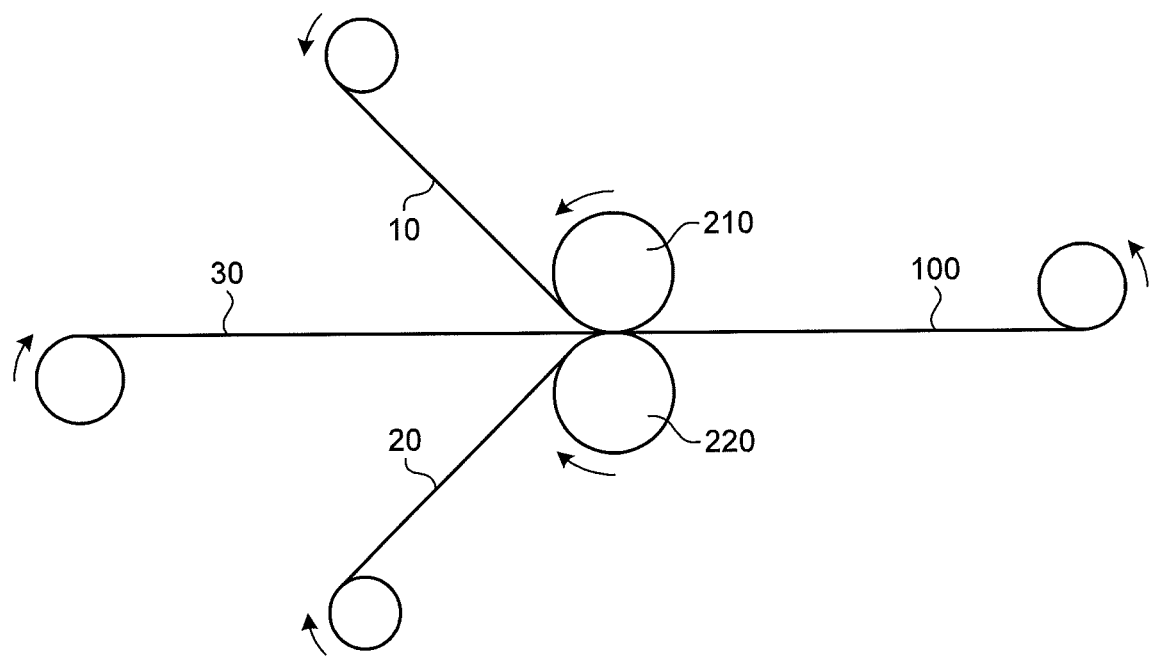
FIG. 2 is a view schematically illustrating a step of thermally compression-bonding a gas barrier multilayer body (A), a gas barrier multilayer body (B), and a film (c) of a styrene-based thermoplastic elastomer resin in a method for producing a composite gas barrier multilayer body according to an embodiment of the present invention.

FIG. 2 is a view schematically illustrating a step of thermally compression-bonding the gas barrier multilayer body (A) 10, the gas barrier multilayer body (B) 20, and the film (c) of the styrene-based thermoplastic elastomer resin in the method for producing the composite gas barrier multilayer body 100 according to an embodiment of the present invention. The film (c) of the styrene-based thermoplastic elastomer resin corresponds to the same member as the layer 30 of the styrene-based thermoplastic elastomer resin, and will be described using the same reference sign "30".

As shown in FIG. 2, the gas barrier multilayer body (A) 10, the gas barrier multilayer body (B) 20, and the film (c) 30 of a styrene-based thermoplastic elastomer resin are unrolled from each roll, and thermally compression-bonded by using pressure rollers 210 and 220 capable of controlling their temperatures. At this time, the gas barrier multilayer body (A) 10 and the gas barrier multilayer body (B) 20 are placed in such directions that the inorganic layer (a) and the inorganic layer (b) face to the film (c) 30. Since the styrene-based thermoplastic elastomer resin serves as a bonding agent, the gas barrier multilayer body (A) 10 and the gas barrier multilayer body (B) 20 are bonded, to obtain the composite gas barrier multilayer body 100. The resulting composite gas barrier multilayer body 100 is wound up and stored in a roll shape. When the composite gas barrier multilayer body 100 is thus produced by a roll-to-roll method, the productivity can be further enhanced.

The temperature during thermal compression-bonding depends on a temperature at which the film (c) of the styrene-based thermoplastic elastomer resin expresses flowability, but is normally 70° C. or higher, and preferably 80° C. or higher. Thus, the gas barrier multilayer body (A) and the gas barrier multilayer body (B) can be stably bonded to each other. The upper limit of the temperature is normally 250° C. or lower, and preferably equal to or lower than the glass transition temperature Tg ° C. of the alicyclic polyolefin resin that forms the film (a) and the film (b). In particular, when the temperature at which the film (c) of the styrene-based thermoplastic elastomer resin expresses flowability is set to be equal to or lower than the glass transition temperature Tg of the alicyclic polyolefin resin and thermal compression-bonding is performed at a temperature equal to or lower than Tg, the film (a) and the film (b) can be prevented from being deformed due to heat, thermally shrinking before and after a pressurization and compression-bonding process, and being degenerated.

A pressure applied by the pressure roller during thermal compression-bonding is normally 0.1 MPa or higher. Thus, the gas barrier multilayer body (A) and the gas barrier multilayer body (B) can be stably bonded to each other. The upper limit of the pressure is normally 1.5 MPa or lower, and preferably 1.0 MPa or lower. Thus, the inorganic layer (a) or the inorganic layer (b) can be prevented from cracking by excess pressure.

When the gas barrier multilayer body (A), the gas barrier multilayer body (B), and the film (c) of the styrene-based thermoplastic elastomer resin are prepared as long-length films and the long-length films are thermally compression-bonded while they are transported through a line, the line speed during transportation is normally 0.1 m/min or more, preferably 0.2 m/min or more, more preferably 0.3 m/min or more, and 5 m/min or less, preferably 3 m/min or less, and more preferably 2 m/min or less. When the line speed is equal to or more than the lower limit of the range, efficient production is possible. When the line speed is equal to or less than the upper limit, the gas barrier multilayer body (A) and the gas barrier multilayer body (B) can be stably bonded to each other.

8. Application of Composite Gas Barrier Multilayer Body]

Applications of the composite gas barrier multilayer body are not particularly limited. However, the composite gas barrier multilayer body may be used as a component of devices such as a liquid crystal display device, a display device and a light source device that have an organic EL element, and a solar cell. Specifically, the composite gas barrier multilayer body may be used as a film for sealing another component constituting the device for protection against moisture and oxygen.

The composite gas barrier multilayer body may be used as a composite gas barrier multilayer body for use in an organic EL element as a particularly preferable application.

[9. Composite Electrode]

Figure 3:
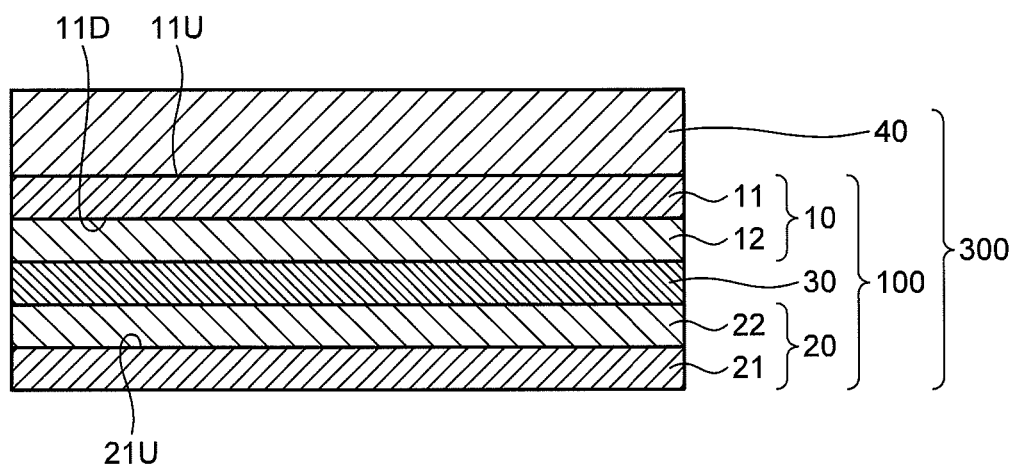
FIG. 3 is a view schematically illustrating a cross section of a composite electrode according to an embodiment of the present invention, the cross section being along a plane perpendicular to a principal plane thereof.

FIG. 3 is a view schematically illustrating a cross section of a composite electrode 300 according to an embodiment of the present invention, the cross section being along a plane perpendicular to a principal plane thereof. As shown in FIG. 3, the composite electrode 300 has the composite gas barrier multilayer body 100 and a transparent electrode 40 that is formed on one outside surface 11U of the composite gas barrier multilayer body 100. In FIG. 3, the same parts as shown in FIG. 1 are shown by the same reference signs as in FIG. 1.

The composite electrode 300 having the composite gas barrier multilayer body 100 in combination with the transparent electrode 40 can function as an electrode, and has excellent gas barrier properties. Therefore, the composite electrode can be suitably used for, for example, an organic photoelectric conversion element such as an organic EL device and an organic solar cell.

Examples of a material for the transparent electrode may include a metal thin film, ITO (indium tin oxide), IZO (indium zinc oxide), and $SnO_2$. One type of them may be solely used, or two or more types thereof may be used in combination at any ratio.

The thickness of the transparent electrode may be normally 10 nm to 1,000 nm.

The transparent electrode may be formed by, for example, a physical vapor deposition method. The physical vapor deposition method is a method in which the material is evaporated or ionized, whereby a coating of the material is formed on a surface of the composite gas barrier multilayer body. Specific examples of the physical vapor deposition method may include a vacuum evaporation method, a sputtering method, an ion plating method, and an ion beam deposition method.

The step of forming the transparent electrode by the physical vapor deposition method is generally performed under a high-temperature or low-pressure environment. At this time, in the composite gas barrier multilayer body, the inorganic layer (a) and the inorganic layer (b) hardly crack under a high-temperature environment, and the gas barrier properties are hardly impaired. In the composite gas barrier multilayer body, outgas is hardly generated from the layer of the styrene-based thermoplastic elastomer resin even under a low-pressure environment. Therefore, when the composite gas barrier multilayer body is used, it is usually possible to select the condition for formation of the transparent electrode freely. Accordingly, the resistance value of the transparent electrode can be decreased. Further, the transparent electrode can be easily produced.

In order to stably prevent the inorganic layer (a) and the inorganic layer (b) from cracking, it is preferable that the step of forming the transparent electrode is performed before the step of forming the inorganic layer (a) and the inorganic layer (b). This is because a severe environment may be required in the step of forming the transparent electrode depending on the types of the transparent electrode. For example, when a composite electrode 300 having a transparent electrode 40 of ITO on a surface 11U of the film (a) 11 as shown in FIG. 3 is produced, it is preferable that the transparent electrode 40 is formed on the surface 11U of the film (a) before the step of forming the inorganic layer (a) 12 on the film (a) 11.

EXAMPLES

The present invention will be specifically described hereinbelow with reference to Examples. However, the present invention is not limited to the following Examples. The present invention may be implemented with any modifications within the scope of the claims and equivalents thereto.

In the following description, "%" and "part" that represent an amount are based on weight unless otherwise specified. In addition, the following operations were performed under conditions of normal temperature and normal pressure unless otherwise specified.

[Measuring Method]
(1. Method for Measuring Curl Amount)

A sample was punched into a 5-cm square. The punched sample piece was disposed on a horizontal board. At this time, the sample piece was disposed so that a concave curl was formed vertically upward. Distances of four points in respective corners of the disposed sample piece from the board were measured. The average value of the measured distances in the four points was calculated as the curl amount.

(2. Method for Measuring Moisture Vapor Transmission Rate)

A pressure of moisture vapor corresponding to 90% RH at 40° C. was applied at both sides of the sample, and the moisture vapor transmission rate was measured using a differential pressure-type measurement device having a circular measurement region with a diameter of 8 cm.

Example 1

An alicyclic polyolefin resin film (film containing a norbornene polymer, "ZEONOR film ZF16" available from ZEON CORPORATION, thickness: 100 μm) was unrolled from a roll of the film, and on one surface of the film, an SiN layer having a thickness of 100 nm was formed using a sputtering device, to obtain a gas barrier multilayer body (A). The resulting gas barrier multilayer body (A) had a curl with a curl amount of 4 mm.

A gas barrier multilayer body (B) was produced by the same method as that of the gas barrier multilayer body (A).

A film of a styrene-isoprene-styrene copolymer having a thickness of 100 μm was prepared as a thermoplastic elastomer film. The styrene-isoprene-styrene copolymer is a polymer obtained by hydrogenating an aromatic vinyl compound-conjugated diene block copolymer produced using styrene as an aromatic vinyl compound and isoprene as a linear conjugated diene copolymer, followed by modification with alkoxysilane. The styrene-isoprene-styrene copolymer has a triblock structure in which a polymer block [A] is bonded to both ends of a polymer block [B]. This styrene-isoprene-styrene copolymer had a weight average molecular weight (Mw) of 48,000. The ratio "wA/wB" that is the weight ratio of the polymer blocks was 50/50, and the ratio "Mw(A1)/Mw(A2)" that is the weight average molecular weight of the polymer block [A] was 1.1. The hydrogenation ratio was 99.9%.

The gas barrier multilayer body (A) and the gas barrier multilayer body (B) were disposed so that the SiN layers faced to each other, and the thermoplastic elastomer film was thus interposed between the gas barrier multilayer bodies. The gas barrier multilayer body (A), the thermoplastic elastomer film, and the gas barrier multilayer body (B), which were stacked, were transported in a lengthwise direction while they were pressurized from both sides using a pair of opposed resin rollers. At this time, the temperature of the resin rollers was adjusted to 150° C. The line speed during transportation was set to 0.3 m/min. The pressurization strength by the resin rollers was set to 0.1 MPa. Thus, the gas barrier multilayer body (A), the thermoplastic elastomer film, and the gas barrier multilayer body (B) were thermally compression-bonded, to obtain a composite gas barrier multilayer body having a structure of (alicyclic polyolefin resin film)—(SiN layer)—(thermoplastic elastomer film)—(SiN layer)—(alicyclic polyolefin resin film).

The curl amount and moisture vapor transmission rate of the resulting composite gas barrier multilayer body were measured. The curl amount was 1 mm or less and the moisture vapor transmission rate was $8\times10^{-3}$ g/m$^2$·day.

The composite gas barrier multilayer body was left under an environment of 150° C. for 1 hour, and then taken out into a normal temperature environment. The appearance thereof was observed, and the moisture vapor transmission rate was measured. The appearance was not changed and the moisture vapor transmission rate remained at $8\times10^{-3}$ g/m$^2$·day.

The obtained composite gas barrier multilayer body was placed in a chamber, and air was exhausted from the chamber with a vacuum pump ("GHD-030" manufactured by ULVAC KIKO, Inc.). After about 20 hours, the pressure in the chamber reached $1\times10^{-4}$ torr.

The composite gas barrier multilayer body was bent, but crack did not appear.

Example 2

An alicyclic polyolefin resin film (film containing a norbornene polymer, "ZEONOR film ZF16" available from ZEON CORPORATION, thickness: 100 μm) was unrolled from a roll of the film, and on one surface of the film, an SiOC layer having a thickness of 1 μm was formed using a plasma CVD device, to obtain a gas barrier multilayer body (A). The resulting gas barrier multilayer body (A) had a curl with a curl amount of 15 mm.

A gas barrier multilayer body (B) was produced by the same method as that of the gas barrier multilayer body (A).

A thermoplastic elastomer film that was the same as the one used in Example 1 was prepared.

The gas barrier multilayer body (A) and the gas barrier multilayer body (B) were disposed so that the SiOC layers faced to each other, and the thermoplastic elastomer film was interposed between the gas barrier multilayer bodies. The gas barrier multilayer body (A), the thermoplastic elastomer film, and the gas barrier multilayer body (B), which were stacked, were transported in a lengthwise direction while they were pressurized from both sides using a pair of opposed resin rollers under the same conditions as in Example 1. Thus, the gas barrier multilayer body (A), the thermoplastic elastomer film, and the gas barrier multilayer body (B) were thermally compression-bonded, to obtain a composite gas barrier multilayer body having a structure of (alicyclic polyolefin resin film)—(SiOC layer)—(thermoplastic elastomer film)—(SiOC layer)—(alicyclic polyolefin resin film).

The curl amount and moisture vapor transmission rate of the resulting composite gas barrier multilayer body was measured. The curl amount was 1 mm or less and the moisture vapor transmission rate was $5\times10^{-4}$ g/m$^2$·day.

The composite gas barrier multilayer body was left under an environment of 150° C. for 1 hour. The appearance thereof was observed, and the moisture vapor transmission rate was measured. The appearance was not changed and the moisture vapor transmission rate remained at $5\times10^{-4}$ g/m$^2$·day.

The composite gas barrier multilayer body was bent in the same manner as in Example 1, but crack did not appear.

Comparative Example 1

A composite gas barrier multilayer body was produced in the same manner as in Example 1 except that a polyethylene terephthalate film was used in place of the alicyclic polyolefin resin film.

The curl amount and moisture vapor transmission rate of the resulting composite gas barrier multilayer body were measured. The curl amount was 1 mm or less and the moisture vapor transmission rate was $1\times10^{-2}$ g/m$^2$·day.

The composite gas barrier multilayer body was left under an environment of 150° C. for 1 hour, and then taken out into a normal temperature environment. The moisture vapor transmission rate was measured. The moisture vapor transmission rate was deteriorated to $5\times10^{-2}$ g/m$^2$·day.

Comparative Example 2

A composite gas barrier multilayer body was produced in the same manner as in Example 1 except that the gas barrier multilayer body (A) and the gas barrier multilayer body (B) were bonded using a solvent-free acryl-based UV curable resin ("DAIOLET PS3A" available from Daido Chemical Corporation) in a thickness of 100 µm in place of the thermoplastic elastomer film.

The curl amount and moisture vapor transmission rate of the resulting composite gas barrier multilayer body were measured. The curl amount was 1 mm or less and the moisture vapor transmission rate was $8\times10^{-3}$ g/m$^2$·day. However, when the composite gas barrier multilayer body was bent in the same manner as in Example 1, cracks easily appeared.

Comparative Example 3

A composite gas barrier multilayer body was produced in the same manner as in Example 1 except that a layer having a thickness of 100 µm obtained by stacking four films of an acryl-based adhesive ("CS9621" available from Nitto Denko Corporation, thickness: 25 µm) in place of the thermoplastic elastomer film.

The curl amount and moisture vapor transmission rate of the resulting composite gas barrier multilayer body were measured. The curl amount was 1 mm or less and the moisture vapor transmission rate was $8\times10^{-3}$ g/m$^2$·day. The composite gas barrier multilayer body was placed in a chamber, and air was exhausted from the chamber with a vacuum pump in the same manner as in Example 1. After approximately 20 hours, the pressure in the chamber was $6\times10^{-4}$ torr, and after 30 hours, the pressure in the chamber was $2\times10^{-4}$ torr. Vacuum exhaustion thus took time.

[Discussion]

With the composite gas barrier multilayer bodies obtained in Examples 1 and 2, the curl amount is small. This shows that the present invention can achieve a composite gas barrier multilayer body that is hardly curled.

In Comparative Example 1, the gas barrier properties are reduced under a high-temperature environment. In Comparative Example 2, cracks easily appear by bending and the gas barrier properties are impaired. In Comparative Example 3, a gas is generated from the composite gas barrier multilayer body under a low-pressure environment, and as a result, the gas barrier properties are reduced. In contrast, in the composite gas barrier multilayer bodies obtained in Examples 1 and 2, a reduction in gas barrier properties under a high-temperature environment, appearing of a crack by bending, and generation of a gas from the composite gas barrier multilayer bodies themselves are suppressed. This shows that the present invention can achieve a composite gas barrier multilayer body that is pliable, has excellent flexibility, and easily allows gas barrier properties to be favorably maintained.

REFERENCE SIGNS LIST 10 gas barrier multilayer body (A)
11 film (a)
12 inorganic layer (a)
20 gas barrier multilayer body (B)
21 film (b)
22 inorganic layer (b)
30 layer of a styrene-based thermoplastic elastomer resin (film (c))
40 transparent electrode
100 composite gas barrier multilayer body
210, 220 pressure roller
300 composite electrode

The invention claimed is:

1. A composite gas barrier multilayer body, comprising:
a gas barrier multilayer body (A) having a film (a) of an alicyclic polyolefin resin and an inorganic layer (a) formed on at least one surface of the film (a) and
a gas barrier multilayer body (B) having a film (b) of an alicyclic polyolefin resin and an inorganic layer (b) formed on at least one surface of the film (b),
wherein the gas barrier multilayer body (A) and the gas barrier multilayer body (B) are bonded via a layer of a styrene-based thermoplastic elastomer resin so that the inorganic layer (a) and the inorganic layer (b) face to each other,
the styrene-based thermoplastic elastomer resin comprises a hydride of an aromatic vinyl compound-conjugated diene block copolymer that is modified by alkoxysilane
the hydride of the aromatic vinyl compound-conjugated diene block copolymer is obtained by hydrogenation of a carbon-carbon unsaturated bond in a main chain and a side chain and a carbon-carbon unsaturated bond in an aromatic ring of the aromatic vinyl compound-conjugated diene block copolymer, and
each of the gas barrier multilayer body (A) and the gas barrier multilayer body (B) has a moisture vapor transmission rate of $2\times10^{-2}$ g/m$^2$·day or less.

2. The composite gas barrier multilayer body according to claim 1, wherein
the layer of the styrene-based thermoplastic elastomer resin has a thickness of 10 µm to 150 µm, and
the aromatic vinyl compound of the hydride of the aromatic vinyl compound-conjugated diene block copolymer that is modified by alkoxysilane is styrene.

3. The composite gas barrier multilayer body according to claim 1, wherein
the inorganic layer (a) and the inorganic layer (b) are each a layer that is formed by a chemical vapor deposition method and contains at least Si, and
the inorganic layer (a) and the inorganic layer (b) each have a thickness of 300 nm to 2,000 nm.

4. The composite gas barrier multilayer body according to claim 1, wherein
the inorganic layer (a) and the inorganic layer (b) are formed of the same material and have the same thickness, and
the film (a) and the film (b) are formed of the same material and have the same thickness.

5. A composite electrode for an organic EL element, comprising the composite gas barrier multilayer body according to claim 1, and a transparent electrode formed on one outside surface of the composite gas barrier multilayer body by a physical vapor deposition method.

6. A method for producing a composite gas barrier multilayer body, comprising the steps of:
forming an inorganic layer (a) on at least one surface of a film (a) of an alicyclic polyolefin resin to obtain a gas barrier multilayer body (A);
forming an inorganic layer (b) on at least one surface of a film (b) of an alicyclic polyolefin resin to obtain a gas barrier multilayer body (B); and stacking the gas barrier multilayer body (A), the gas barrier multilayer body (B), and a film (c) of a styrene-based thermoplastic elastomer resin so that the film (a), the inorganic layer (a), the film (c), the inorganic layer (b), and the film (b) are layered in this order, and then thermally compression-bonding the stack, wherein the styrene-based thermoplastic elastomer resin comprises a hydride of an aromatic vinyl compound-conjugated diene block copolymer that is modified by alkoxysilane, the hydride of the aromatic vinyl compound-conjugated diene block copolymer is obtained by hydrogenation of a carbon-carbon unsaturated bond in a main chain and a side chain and a carbon-carbon unsaturated bond in an aromatic ring of the aromatic vinyl compound-conjugated diene block copolymer, and each of the gas barrier multilayer body (A) and the gas barrier multilayer body (B) has a moisture vapor transmission rate of $2 \times 10^{-2}$ g/m$^2$·day or less.

7. The composite gas barrier multilayer body according to claim 1, wherein the moisture vapor transmission rate is $1 \times 10^{-2}$ g/m$^2$·day or less.

8. The method according to claim 6, wherein the moisture vapor transmission rate is $1 \times 10^{-2}$ g/m$^2$·day or less.

9. The composite gas barrier multilayer body according to claim 1, wherein a material for forming either or both of inorganic layer (a) and inorganic layer (b) is a metal; an oxide, a nitride, or a nitride oxide of silicon; an oxide, a nitride, or a nitride oxide of aluminum; a diamond-like carbon; or a mixed material of two or more thereof.

10. The method according to claim 6, wherein a material for forming either or both of inorganic layer (a) and inorganic layer (b) is a metal; an oxide, a nitride, or a nitride oxide of silicon; an oxide, a nitride, or a nitride oxide of aluminum; a diamond-like carbon; or a mixed material of two or more thereof.

* * * * *